(12) United States Patent
Horch et al.

(10) Patent No.: US 7,652,921 B2
(45) Date of Patent: Jan. 26, 2010

(54) MULTI-LEVEL NON-VOLATILE MEMORY CELL WITH HIGH-VT ENHANCED BTBT DEVICE

(75) Inventors: Andrew E. Horch, Seattle, WA (US); Bin Wang, Seattle, WA (US)

(73) Assignee: Virage Logic Corporation, Fremont, CA (US)

( * ) Notice: Subject to any disclaimer, the term of this patent is extended or adjusted under 35 U.S.C. 154(b) by 113 days.

(21) Appl. No.: 12/080,127

(22) Filed: Mar. 31, 2008

(65) Prior Publication Data
US 2008/0279013 A1 Nov. 13, 2008

Related U.S. Application Data

(60) Provisional application No. 60/928,762, filed on May 11, 2007.

(51) Int. Cl.
*G11C 16/04* (2006.01)
(52) U.S. Cl. .............................. 365/185.1; 365/185.05
(58) Field of Classification Search .............. 365/185.1, 365/185.05, 185.03, 185.26
See application file for complete search history.

(56) References Cited

U.S. PATENT DOCUMENTS

| | | | |
|---|---|---|---|
| 5,598,369 A | 1/1997 | Chen et al. | |
| 5,657,271 A | 8/1997 | Mori | |
| 6,143,607 A | 11/2000 | Chi | |
| 6,181,601 B1 | 1/2001 | Chi | |
| 6,442,074 B1 | 8/2002 | Hamilton et al. | |
| 6,510,086 B2 | 1/2003 | Kato et al. | |
| 6,781,881 B2 | 8/2004 | Chih | |
| 6,853,583 B2 * | 2/2005 | Diorio et al. ........... 365/185.21 |
| 6,950,342 B2 | 9/2005 | Lindhorst et al. | |
| 2002/0027233 A1 | 3/2002 | Yamaki et al. | |
| 2002/0159298 A1 | 10/2002 | Hirano | |
| 2005/0030827 A1 * | 2/2005 | Gilliland et al. ............. 365/232 |
| 2008/0049519 A1 | 2/2008 | Horch | |
| 2008/0056010 A1 | 3/2008 | Horch | |

OTHER PUBLICATIONS

Chang, C.Y. et al., "ULSI Devices", John Wiley & Sons, pp. 119-124, 2000.

(Continued)

*Primary Examiner*—Vu A Le
(74) *Attorney, Agent, or Firm*—Nixon Peabody LLP; David B. Ritchie

(57) ABSTRACT

The present disclosure provides a Non-Volatile Memory (NVM) cell and programming method thereof. The cell can denote at least two logic levels. The cell has a read-transistor with a floating gate, and Band-To-Band-Tunneling device (BTBT device) sharing the floating gate with the read-transistor. The BTBT device is configured as an injection device for injecting a first charge onto the floating gate when the BTBT device is biased with a first gate bias voltage such that the BTBT device is in accumulation, to set at least one of the logic levels. A first electrode is coupled to bias the BTBT device with a first bias voltage that is higher than the first threshold voltage. The first bias voltage is controlled such that the BTBT device is in accumulation during a write operation. The injected amount of charge on the floating gate is determined by the first bias voltage.

25 Claims, 23 Drawing Sheets

MEMORY CELL USING HIGH-VT
ENHANCED BTBT INJECTION DEVICE

OTHER PUBLICATIONS

Chen, Ih-Chin et al., "A Quantitative Physical Model for the Band-to-Band Tunneling-Induced Substrate Hot Electron Injection in MOS Devices", IEEE Transactions on Electron Devices, vol. 39, No. 7, pp. 1646-1651, Jul. 1992.

Figueroa, Miguel et al., "A Mixed-Signal Approach to High-Performance Low-Power Linear Filters", IEEE Journal of Solid State Circuits, vol. 36, No. 5, pp. 816-822, May 2001.

Hyde, John et al., "A floating-gate trimmed, 14-bit, 250 Ms/s digital-to-analog converter in standard 0.25 µm CMOS", Symposium on VLSI Circuits Digest of Technical Papers, pp. 328-331, 2002.

Office Action for U.S. Appl. No. 11/601,305 mailed May 22, 2008.

Response to Office Action for U.S. Appl. No. 11/601,305, filed Sep. 22, 2008.

Office Action for U.S. Appl. No. 11/601,474 mailed Dec. 28, 2007.

Response to Office Action for U.S. Appl. No. 11/601,474, filed Mar. 28, 2008.

* cited by examiner

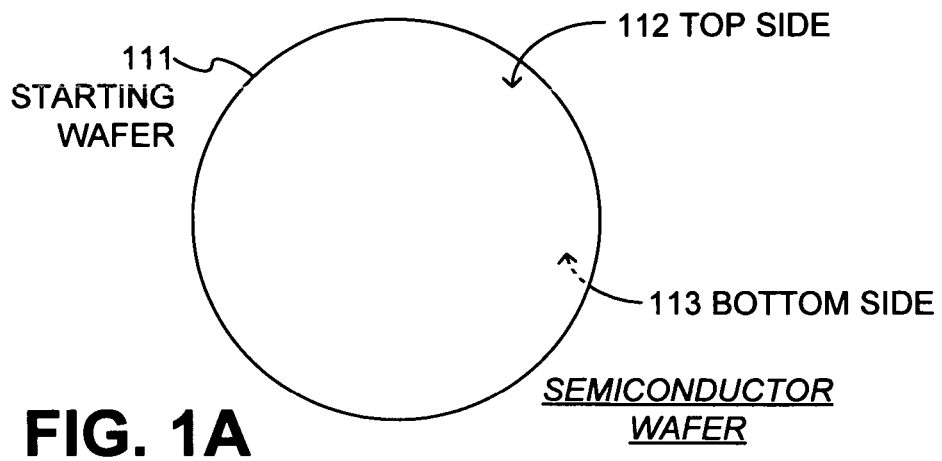
FIG. 1A SEMICONDUCTOR WAFER
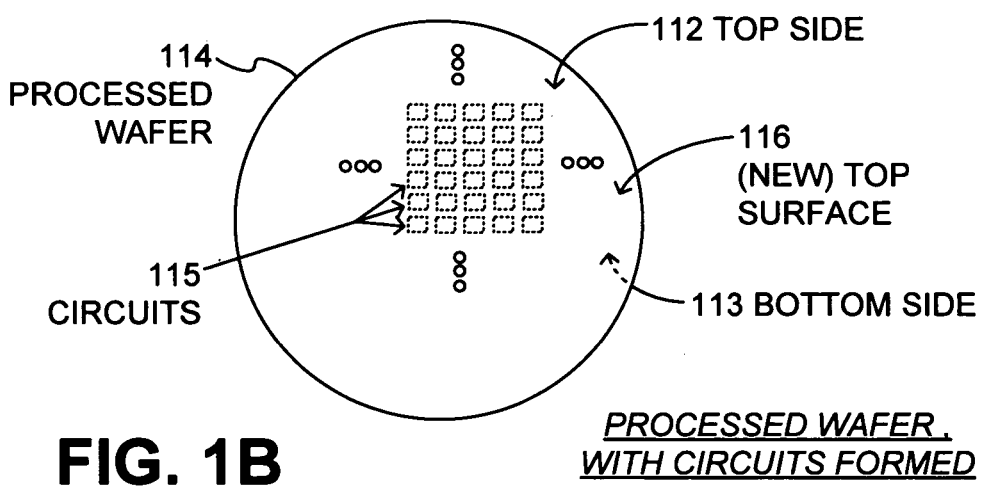
FIG. 1B PROCESSED WAFER, WITH CIRCUITS FORMED
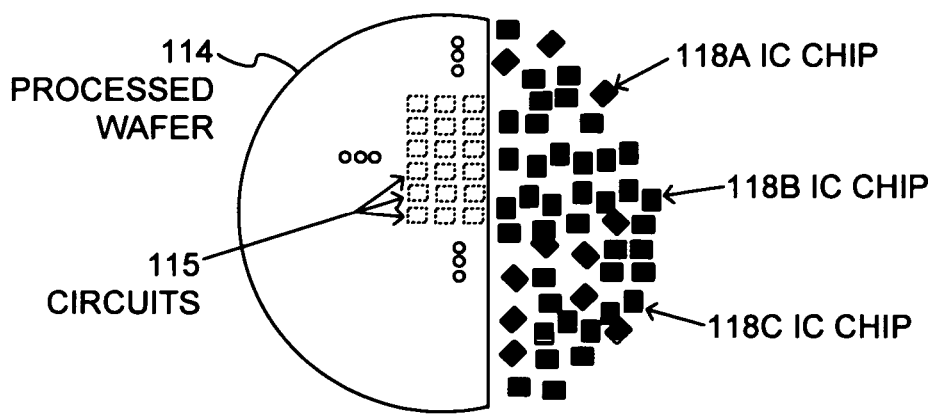
FIG. 1C WAFER BEING SEPARATED INTO INTEGRATED CIRCUIT (IC) CHIPS

*MEMORY CIRCUIT INCORPORATING CELLS USING HIGH-VT ENHANCED BTBT INJECTION DEVICES*

MEMORY CELL USING REGULAR
ENHANCED BTBT INJECTION DEVICE

CROSS SECTION OF HIGH-VT ENHANCED BTBT PMOS INJECTION DEVICE (Q6)

CROSS SECTION OF HIGH-VT ENHANCED BTBT
PMOS INJECTION DEVICE WITH VT ADJUST IMPLANT

CROSS SECTION OF HIGH-VT ENHANCED BTBT
PMOS INJECTION DEVICE WITH N+ POLY GATE

CROSS SECTION OF ENHANCED BTBT P+ POLY GATE NMOS INJECTION DEVICE WITHOUT LDD IMPLANT

CROSS SECTION OF ENHANCED BTBT N+ POLY PMOS INJECTION DEVICE WITHOUT LDD IMPLANT

1150A

| OPERATION / VOLTAGES | SOURCE/NWELL | READ S | BTBT. S | TUN. |
|---|---|---|---|---|
| PROGRAM | VDD_IO x 2 | 0 | 0 | VDD_IO x 2 |
| READ | VDD_L | 0 | 0 | VDD_L |
| ERASE | 0 | 0 | 0 | VDD_IO x 3 |

*CONTROL VOLTAGE LEVEL DURING OPERATIONS OF*
*NVN CELL OF FIG. 3A WITH REGULAR ENHANCED BTBT*

| OPERATION / VOLTAGES | SOURCE/NWELL | READ S | PROG. S | TUN. |
|---|---|---|---|---|
| PROGRAM | VBTBT | 0 | VDD_IO | VTUN |
| READ | VDD_L | VDD_IO | 0 | 0 |
| ERASE | 0 | 0 | VDD_IO | VTUN |

*CONTROL VOLTAGE LEVEL DURING OPERATIONS OF*
*NVN CELL OF FIG.7A WITH HIGH-VT ENHANCED BTBT*

FIG. 11B

METHOD OF WRITING TO A FLOATING GATE
WITH A HIGH-VT ENHANCED BTBT

*FG WITH ML (2 BITS EXAMPLE)*

1550

| ACTION | ST. DATA | BIT LINE | SOURCE | READ SEL. L. | TUN | PROGRAM SEL. L. |
|---|---|---|---|---|---|---|
| ERASE | 00 | 0 | 0 | V1 | VTUN | V1 |
| WRITE | 01 | 0 | V2 | 0 | V5 | V1 |
| WRITE | 10 | 0 | V3 | 0 | V6 | V1 |
| WRITE | 11 | 0 | V4 | 0 | V7 | V1 |

*ML PROGRAMMING CONDITIONS OF NVN CELL OF FIG.7A*

| ACTION | ST. DATA | BIT LINE | SOURCE/ NWELL | READ SEL. L. | PROG. | PROGRAM SEL. L. | TUN |
|---|---|---|---|---|---|---|---|
| ERASE | 00 | 0 | 0 | 0 | 0 | 0 | VTUN |
| WRITE | 01 | V1 | V1 | 0 | 0 | 0 | V4 |
| WRITE | 10 | V2 | V2 | 0 | 0 | 0 | V5 |
| WRITE | 11 | V3 | V3 | 0 | 0 | 0 | V6 |

*ML PROGRAMMING CONDITIONS OF NVN CELL OF FIG.16A*

MEMORY CELL USING HIGH-VT ENHANCED
BTBT PMOS FOR BOTH WRITING AND ERASING

| ACTION | ST. DATA | BIT LINE | SOURCE/ NWELL | READ SEL. L. | PROGRAM | PROGRAM SEL. L. |
|---|---|---|---|---|---|---|
| ERASE | 00 | 0 | 0 | V1 | VTUN | VTUN + VT |
| WRITE | 01 | V2 | V2 | V2 + VT1 | 0 | >VT2 |
| WRITE | 10 | V3 | V3 | V3 + VT1 | 0 | >VT2 |
| WRITE | 11 | V4 | V4 | V4 + VT1 | 0 | >VT2 |

ML PROGRAMMING CONDITIONS OF NVN CELL OF FIG. 17A

| ACTION | ST. DATA | BIT LINE | SOURCE | READ SEL. L. | PWELL | PROGRAM | PROGRAM SEL. L. |
|---|---|---|---|---|---|---|---|
| ERASE | 00 | 0 | 0 | V1 | VTUN | VTUN | VTUN + VT2 |
| WRITE | 01 | V2 | V2 | V2 + VT1 | V1 | 0 | VT2 |
| WRITE | 10 | V3 | V3 | V3 + VT1 | V1 | 0 | VT2 |
| WRITE | 11 | V4 | V4 | V4 + VT1 | V1 | 0 | VT2 |

ML PROGRAMMING CONDITIONS OF NVN CELL OF FIG. 18A

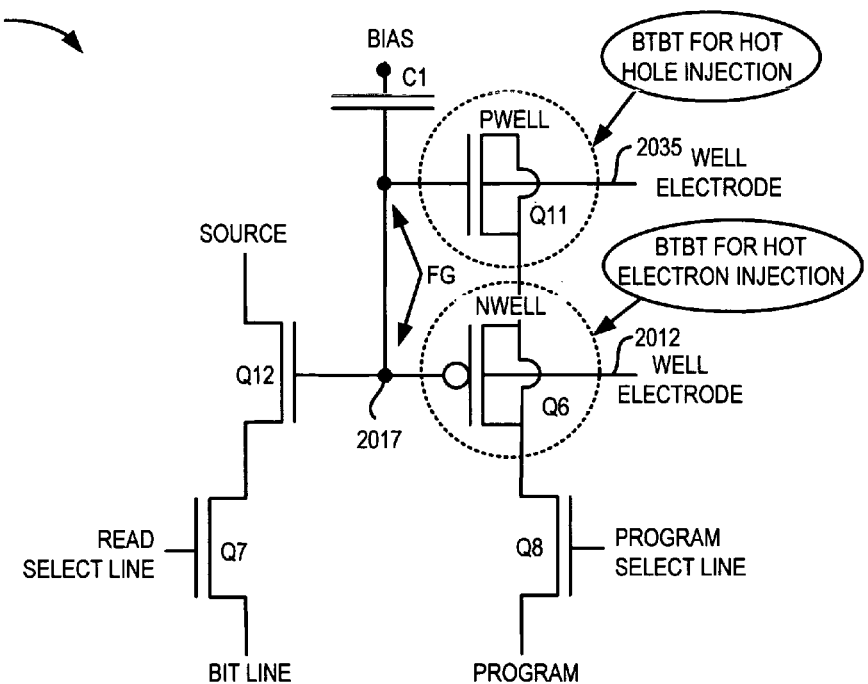
FIG. 20A  *MEMORY CELL USING HIGH-VT ENHANCED BTBT PMOS AND NMOS*
| ACTION | BIT LINE | SOURCE | READ SEL. L. | NWELL | PWELL | PROGRAM | PROGRAM SEL. L. | CAPACITOR BIAS |
|---|---|---|---|---|---|---|---|---|
| READ | PR.CH. 0 FLOAT | VDD | VDD | 0 | 0 | 0 | 0 | 0 |
| WRITE 00 | 0 | 0 | 0 | 0 | 0 | V2 | 0 | 0 |
| WRITE 01 | V1 | V1 | V1 | V2 | 0 | 0 | V2 | V3 |
| WRITE 10 | V1 | V1 | V1 | V2 | 0 | 0 | V2 | V4 |
| WRITE 11 | V1 | V1 | V1 | V2 | 0 | 0 | V2 | V5 |
FIG. 20B  *ML PROGRAMMING CONDITIONS OF NVN CELL OF FIG.20A*

MULTI-LEVEL NON-VOLATILE MEMORY CELL WITH HIGH-VT ENHANCED BTBT DEVICE

CROSS REFERENCE TO RELATED APPLICATIONS

This patent application claims priority from U.S.A. Provisional patent application having Ser. No. 60/928,762 filed on May 11, 2007, the disclosure of which is hereby incorporated by reference for all purposes.

This patent application may be found to be pertinent to commonly owned U.S. patent application Ser. No. 11/601,305 and, filed with the USPTO on Nov. 16, 2006, listing the same inventors, and entitled "NON-VOLATILE MEMORY CELL CIRCUIT WITH PROGRAMMING THROUGH BAND-TO-BAND TUNNELING AND IMPACT IONIZATION GATE CURRENT".

This patent application may be found to be pertinent to commonly owned U.S. patent application Ser. No. 11/601,474 and, filed with the USPTO on Nov. 16, 2006, listing the same inventors, and entitled "NON-VOLATILE MEMORY WITH PROGRAMMING THROUGH BAND-TO-BAND TUNNELING AND IMPACT IONIZATION GATE CURRENT".

FIELD OF THE INVENTION

The present description is related to the field of non-volatile memory, and more specifically, to a non-volatile memory with programming through band-to-band tunneling.

BACKGROUND

Memory devices are electronic devices arranged to store electrical signals. A plurality of memory elements can be combined in various arrangements in order to store multiple bits arranged in words or other combinations. Various electronic circuits including semiconductor devices such as transistors are used as memory elements. Memory elements may be classified in two main categories: volatile and nonvolatile. Volatile memory loses any data as soon as the system is turned off. Thus, it requires constant power to remain viable. Most types of random access memories (RAM) fall into this category. Non-volatile memory does not lose its data when the system or device is turned off.

Demand for embedded nonvolatile memory (NVM) in integrated circuits has grown steadily over the past decade. Desirable characteristics of embedded NVM include low cost, low power, high speed, and high reliability (data retention and program/erase cycling endurance). NVM may be embedded in various integrated circuit (IC) technologies such as, for example, the widely used Complementary Metal Oxide Semiconductor (CMOS) technology.

NVM is used to store serial number information, security information, settings, parameters, computer instructions (firmware), and the like. Reprogrammable NVM is particularly important in the field of tags, such as RFID (radio frequency identification) tags, which store information inexpensively and can be remotely sensed without the need to complete an actual circuit with the RFID tag itself.

There is an ever-growing need for NVM with a higher storage density, lower power consumption, and ease of programming.

The disclosure addresses this shortcoming of prior art by enhancing storage density, lowering power consumption during a write cycle and making programming simpler.

BRIEF SUMMARY

The present disclosure provides a Non-Volatile Memory (NVM) cell and programming method thereof. The cell is capable of denoting at least two distinct logic levels. The cell has a read-transistor with a floating gate, and at least a first Band-To-Band-Tunneling device (BTBT device) sharing the floating gate with the read-transistor. The first BTBT device is configured as an injection device for injecting a first charge onto the floating gate when the first BTBT device is biased with a first gate bias voltage such that the BTBT device is in accumulation, to set at least one of the logic levels. A first electrode is coupled to bias the first BTBT device with a first bias voltage that is higher than the first threshold voltage. The first bias voltage is controlled such that the BTBT device is in accumulation during a write operation. The injected amount of charge on the floating gate is determined by the first bias voltage.

The invention offers numerous advantages over prior solutions. It enhances storage density, has lower power consumption during a write cycle than Impact-ionized Hot Electron Injection (IHEI) or Channel Hot Electron Injection (CHEI), and makes programming a specific amount of charge on the FG simpler. The programming is simpler since BTBT of a FG is a self-limiting operation; the injected amount of charge on the floating gate is set by biasing conditions largely independent of programming time (only a minimum time is needed, additional time does not significantly affect the charge on the FG). Therefore, programming with BTBT can be done without voltage checking and without iterations of charge-transfer of the FG.

These and other features and advantages of the invention will be better understood from the specification of the invention, which includes the following Detailed Description and accompanying Drawings.

BRIEF DESCRIPTION OF THE DRAWINGS

The following Detailed Description proceeds with reference to the accompanying Drawings.

FIGS. 1A, 1B, and 1C are snapshots of steps in methods for preparing integrated circuit chips from a silicon wafer according to embodiments.

FIG. 11A shows a table of control voltage levels applied to the NVM cell of FIG. 3A having the regular enhanced BTBT device Q2 during operations.

FIG. 11B shows a table of control voltage levels applied to the NVM cell of FIG. 7A having the High-VT enhanced BTBT device Q6 during operations.

FIG. 20A is schematic diagram of a NVM cell circuit utilizing High-VT enhanced NMOS BTBT and BTBT devices writing according to an embodiment.

FIG. 20B is a table showing ML programming conditions for the NVM cell of FIG. 20A according to an embodiment.

DETAILED DESCRIPTION

Figure 2:
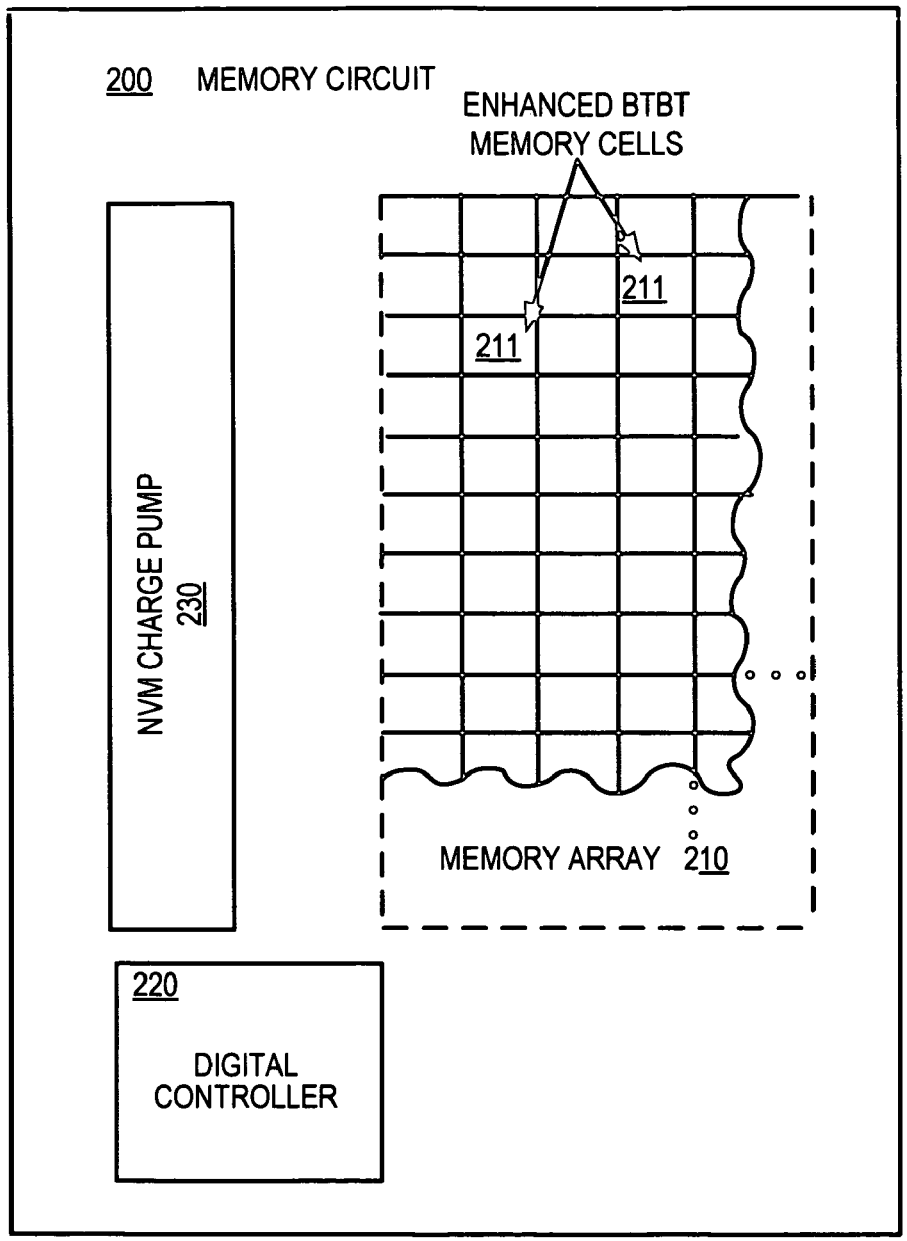
FIG. 2 is a block diagram illustrating an implementation of the memory device according to an embodiment.

The present invention is now described. While it is disclosed in its preferred form, the specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention might be modified in numerous ways. Among other things, the present invention may be embodied as devices, methods, and so on. Accordingly, the present invention may take the form of an entirely device embodiment, an entirely method embodiment, or an embodiment combining aspects of the above. This description is therefore, not to be taken in a limiting sense.

As has been mentioned, the present invention provides a Non-Volatile Memory cell and programming method thereof.

The invention is now described in more detail.

FIGS. 1A, 1B, and 1C are snapshots of a very high-level overview of steps in methods for preparing integrated circuit chips from a silicon wafer according to embodiments in.

FIG. 1A shows a starting wafer 111. Wafer 111 is typically of semiconductor material, such as silicon. The silicon is sometimes doped with p-type or n-type impurities, to improve its electronic properties, as desired for it to operate as a substrate. Wafer 111 has a top side 112 and a bottom side 113 opposite top side 112. Typically, circuits are formed on top side 112, as described below.

FIG. 1B shows a processed wafer 114, which has been derived from wafer 111 after circuits 115 have been formed according to embodiments. Only a few such circuits 115 are shown in FIG. 1B, but that is only by way of illustration. In actual practice, as many as possible such circuits 115 are formed on wafer 111, to increase yield per wafer, and thus reduce the cost of each resulting unit.

Circuits 115 are formed by semiconductor manufacturing machines, often operated by foundries. It is worthwhile to note that circuits 114 are formed at the original surface of top side 112, both beneath the level of the original surface and above it. In addition, other materials are then deposited on top side 112.

FIG. 1C shows that wafer 114 of FIG. 1B is afterwards separated into individual chips 118A, 118B, 118C, etc. Each of individual chips 118A, 118B, 118C, typically contains one of circuits 115, and is thus called an integrated circuit (IC) chip.

FIG. 2 is a block diagram that illustrate a possible implementation of memory circuit 200 according to an embodiment. Memory circuit 200 includes memory array 210, digital controller 220, and charge-pump circuit block 230. Memory array 210 commonly comprises a number of cells e.g., cell 211, which store data to be consumed by operational components. Memory array 210 may be implemented in the form of an NVM array comprising of cells that are addressable in terms of rows and columns. In some embodiments, the NVM memory cell may be constructed using floating-gate MOS transistors. Memory cell 211 stores electrical charges that can represent digital data. An un-programmed memory cell generally has digital datum of "0". To store data other than "0", charges are stored in a floating gate. This operation requires energy from the charge-pump.

Digital controller 220 is arranged to provide the necessary data processing and control signal manipulation capability for write and read operations. It addresses individual cells 211 of memory array 210 during write e.g., program and erase operations. It should be noted that the words program and write are used interchangeably throughout this document when they refer to a memory cell. It also manages the operation of charge-pump 230 and high voltage switches (not shown) for write/read operations to provide required bias conditions and control signals for the cells.

Charge-pump 230 is an electronic circuit that uses capacitors as energy storage elements to convert low voltages into higher voltage outputs. Charge-pump 230 is an essential component of memory circuit 210 since it provides high voltages for the write operation. Due to design constraint, it is desirable to keep a size of charge-pump 230 small. The disclosed NVM memory cell 211 and the associated method provides a current efficient programming that allows the use of smaller charge-pump than the prior art.

Figure 3A:
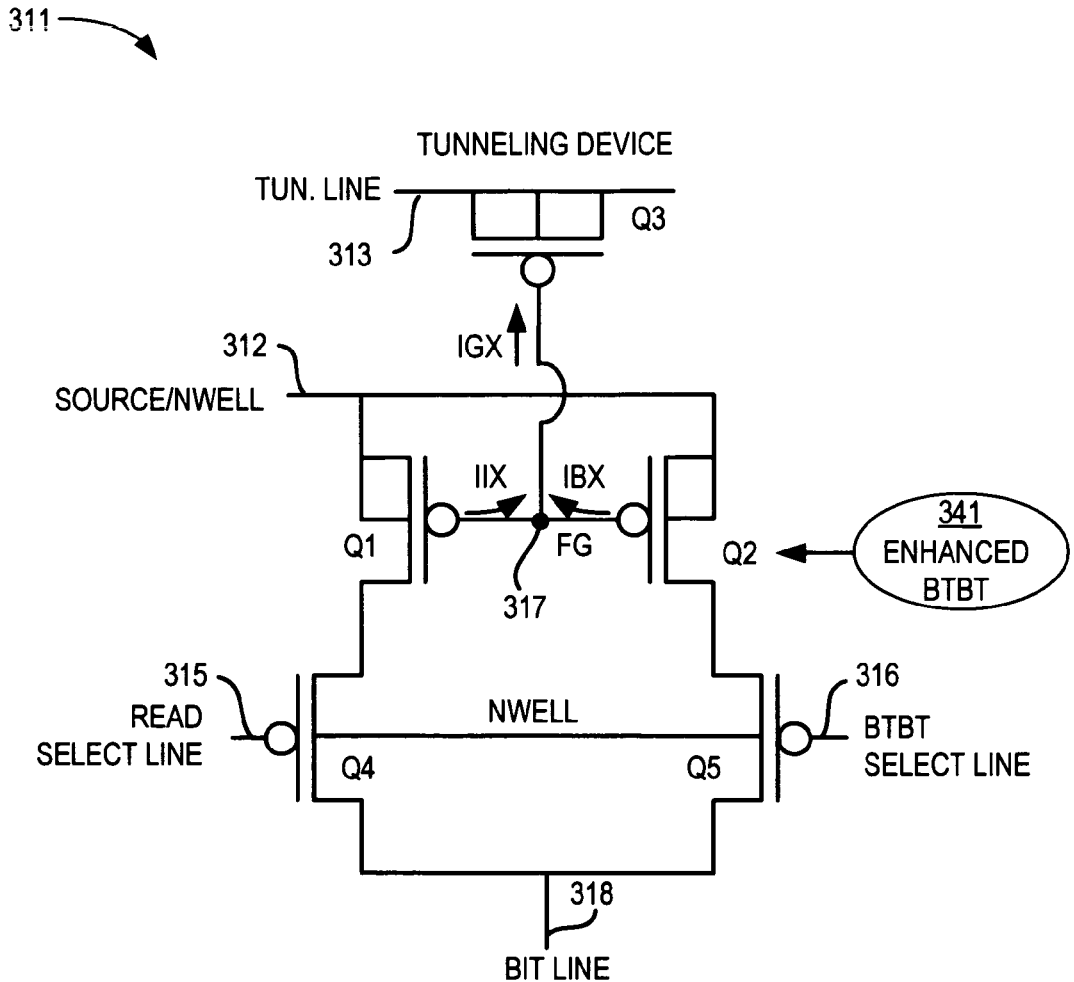
FIG. 3A depicts a non-volatile memory (NVM) cell utilizing a regular enhanced BTBT device.

FIG. 3A shows a schematic diagram of Non-Volatile Memory (NVM) cell 311 utilizing a regular enhanced BTBT device. NVM cell 311 includes a PMOS read-transistor Q1 and PMOS Band-To-Band-Tunneling device (BTBT device) Q2 sharing Floating Gate (FG) 317 with the read-transistor Q1. Coupled to FG 317 is a gate of PMOS tunneling-device Q3.

In operation, in order to program memory NVM cell 311 to a first logic state, transistor Q4 is turned on by selecting line 315, high-energy electrons are added to FG 317 from transistor Q1. To accomplish this, a source/well voltage at electrode 312 is set to a level that causes a substantial VSD voltage drop from the source to the drain of transistor Q1. For example, the voltage at source/well electrode 312 is set to a large positive voltage such as 2*VDD where VDD is a DC supply voltage appropriate for operating logic devices for the expected life of the part, this high voltage creates a large voltage drop across transistor Q1. This large voltage drop corresponds to the establishment of a high intensity electric field running from the source of transistor Q1 to the drain of transistor Q1.

Transistor Q1 is also on, in the sense that the charge level on FG 317 corresponds to a voltage on FG 317 that is sufficiently below a value of VS-VT, where VS is the source voltage of transistor Q1 is set to a value of 2*VDD, and VT is the threshold or turn-on voltage of transistor Q1. When transistor Q1 is sufficiently turned on, a conductive channel is established within the substrate portion of transistor Q1 just beneath its gate dielectric.

In transporting the current within transistor Q1, holes within conductive channel of transistor Q1 flow from source to drain of transistor Q1, and in so doing, are accelerated to very high velocities by the high intensity electric field. These high-energy holes collide with the semiconductor substrate lattice which transistor Q1 is constructed from. The collisions with the lattice create high-energy electrons that have enough energy to surmount an energy barrier of gate dielectric of transistor Q1 and to travel to FG 317 where they are collected. The collection of electrons on FG 317 lowers the charge on the FG below some threshold, which corresponds to a first logic state e.g., a logic "1" or "0".

In order to erase NVM cell 311 and put NVM cell 311 into to a second logical state, electrons are removed from FG 317, and that effectively increases the charge on FG 317 beyond a second threshold, which corresponds to the second logical state. During this process, electrons are tunneled by a Fowler-Nordheim (FN) tunneling mechanism from FG 317 into a semiconductor substrate portion of tunneling-device Q3. In case of FN tunneling, a large positive voltage is applied on the Tun. line 313 to create a strong electric field that runs from the semiconductor substrate portion of tunneling-device Q3 to FG 317. This large positive voltage causes bending an energy band structure of the gate dielectric of tunneling-device Q3 that promotes the tunneling of electrons through the energy barrier that resides between FG 317 and the semiconductor substrate portion of tunneling-device Q3. During FN tunneling, the drain, source, and well of devices Q1 and Q2 are typically held at or near ground (0V).

The ability to accurately control the logic state being held by NVM cell 311 depends on the ability to control the amount of high energy electrons that are injected onto FG 317 from the substrate portion of transistor Q1 during a program operation and on the ability to accurately control the amount of electrons that tunnel from FG 317 into the substrate portion of tunneling-device Q3 during an erase operation. With the ever-decreasing size of transistor dimensions e.g., in terms of gate length and gate dielectric thickness, however, the ability to control these transport mechanisms is proving to be increasingly difficult. For example if too many electrons are removed from FG 317 during the erase operation raising the charge level on FG 317 and a corresponding voltage to too high a level to disable transistor Q1, and to adequately supply high energy electrons to FG 317 during a subsequent program operation. However, this difficulty is avoided by using BTBT device Q2, since BTBT device Q2 can supply additional electrons to FG 317. BTBT device Q2, just like to transistor Q1, uses FG 317 at its own gate node. BTBT device Q2 injects current into FG 317 by a different physical mechanism than transistor Q1. Consequently, BTBT device Q2 is capable of injecting electrons onto FG 317 even though transistor Q1 is not. For example, in the case where a previous erase operation raised the voltage on the FG too high to sufficiently turn on transistor Q1.

A pair of select transistor Q4 and Q5 is coupled serially with read-transistor Q1 and BTBT device Q2 respectively.

During the program operation, source/well electrode 312 is controlled by a high positive voltage, e.g., 2*VDD, while the drain of Q2 is held at a much lower voltage such at 0V. This creates a large electric field across the drain/well junction of device Q2. This strong well-to-drain electric field causes band-to-band tunneling across a PN junction of BTBT device Q2. The electrons tunneling from band to band across the junction can have enough energy to surmount the gate oxide barrier and be injected onto the FG 317. A positive gate voltage on the BTBT device Q2 increases the electric drain/well field near the surface, further increasing BTBT current.

Select lines 315 and 316 are set to GND, to turn on their respective select transistors Q4, and Q5, and permit any current flowing from transistor Q1 and Q2 to flow into bit line 318. Both of the select lines 315 and 316 are driven in part by addressing logic circuitry that identifies this particular cell to be programmed. Bit line 318 is set to GND to provide a potential sink for any current flowing from transistors Q1 and Q2.

During the erase operation, Tun. line 313 is set to a large positive voltage to induce FN tunneling of electrons into the substrate region of tunneling-device Q3. The source/well electrode 312 and the drains of device Q1 and Q2 are all set to a low voltage. No BTBT or IHEI will occur with V(source) =V(well)=V(drain). By making the area (W*L) of devices Q1+Q2 substantially bigger that device Q3 the electric field during FN tunneling will be across device Q3 and not Q1 or Q2. As a result, FN tunneling will only occur on device Q3.

During a read operation, the source/well electrode 312 is set to a positive voltage, between VDD (VDD is low enough not to cause significant charge transfer to the FG 317) and the FG voltages associated with the logical states. Select line 315 is set low to turn on transistor Q4, but BTBT select line 316 is set high to turn off transistor Q5. If FG 317 is in the first logic state "0", both transistors Q1 and Q2 are on but current can only flow from transistor Q1 and not from BTBT device Q2 into drain node 318 because transistor Q5 is off. Transistor Q5 is used to select which row is programmed, device Q4 is off during program to prevent a FG 317 from turning on and pulling down the charge pump. Both Q4 and Q5 may be on during read. If FG 317 is in the second logic state "1", transistors Q1 and Q2 are off and no current flows from bit line 318.

Figure 3B:
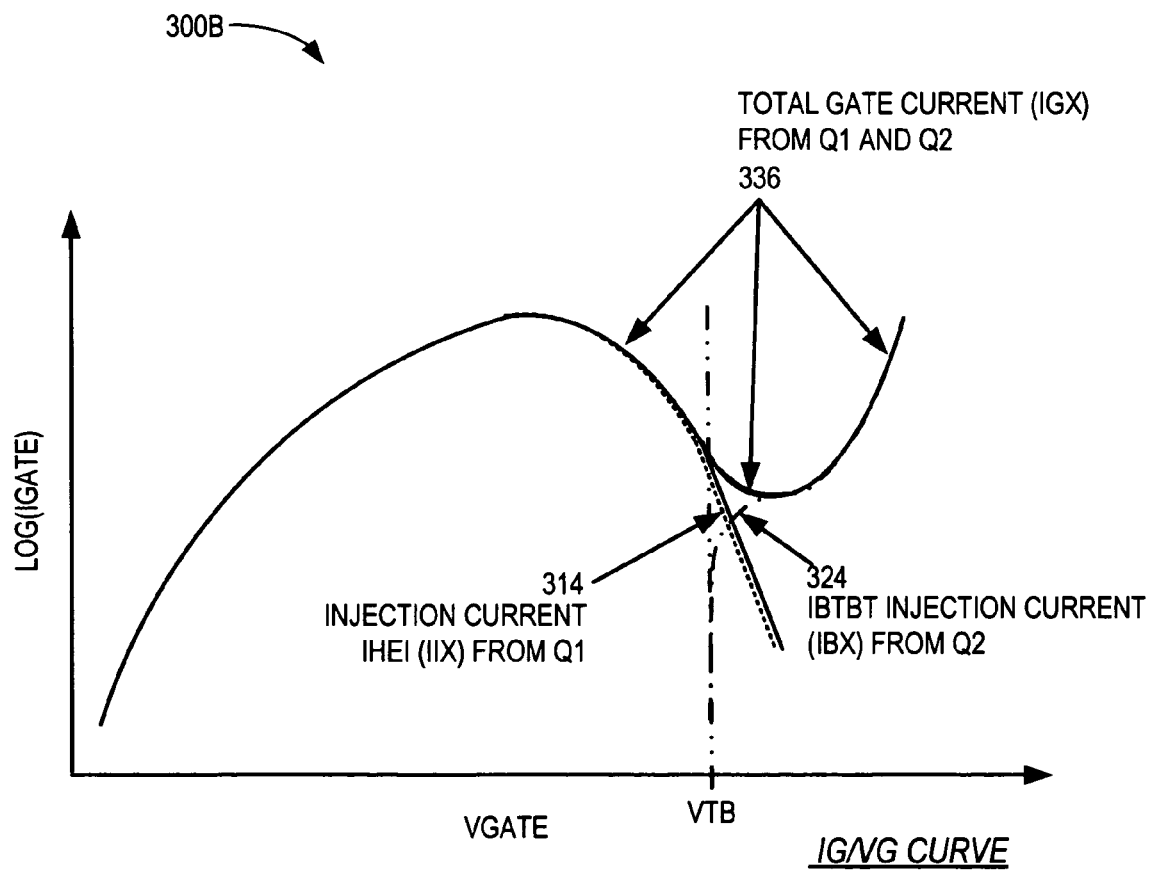
FIG. 3B is a graph showing a gate current of a Floating Gate (FG) of the NVM cell of FIG. 3A that illustrates the contribution to the gate electrode current from both an impact ionization current component and a band-to-band-tunneling current component.

FIG. 3B is graph 300B that shows gate current IGX of FG 317 of the NVM cell 311 of FIG. 3A. Graph 300B shows that the total FG node current IGX 336 is the summation of two gate injection currents, Impact Ionization Induced Injection current IIX 314 contributed by transistor Q1 and BTBT induced injection current IBX 324 contributed by BTBT device Q2. BTBT device Q2 injects electrons onto FG 317 by way of a BTBT induced injection. Injection current IBX 324 is different from the Impact Ionization Induced Injection current IIX 314 from transistor Q1. Curve 324 shows increasing gate current with an increase in gate voltage from BTBT device Q2. Thus BTBT device Q2 effectively compensates for a diminishing of injection current IIX from transistor Q1. Contribution of BTBT device Q2 to the total gate current IGX assures sufficient electron flow into FG 317 over a wider span of operating regions.

Figure 4A:
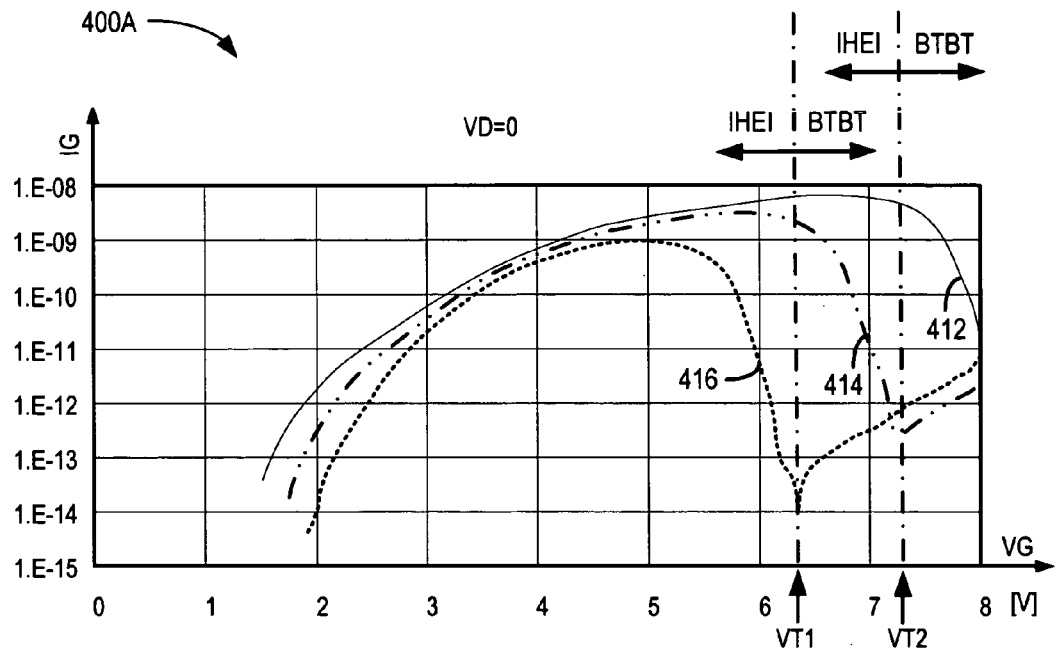
FIG. 4A shows graphs of measured gate currents of an exemplary regular PMOS transistor resulting from impact ionization and BTBT within the transistor's conductive channel.

FIG. 4A shows graph 400A, measured gate currents of an exemplary regular PMOS transistor resulting from impact-ionized hot electron injection when a conductive inversion channel exists and BTBT across the drain/well junction when the channel region is in accumulation. During the measurement, VD was held at 0 V. Graph 400A shows gate current (IG) as a function of gate voltage VG for a regular 3.3 V PMOS transistor manufactured in a standard logic process at a major foundry using a 90 nm process node. Plots 412, 414, and 416 show gate currents while drain voltage (VD) is zero V, source/substrate voltages are 8.5 V, 7.5 V, and 6.5 V respectively. Note the different contributions to a gate current by the different injection mechanisms, i.e. IHEI and BTBT injection. At VG higher than VTB BTBT injection dominates, while at VG lower than VTB there is only IHEI injection.

Figure 4B:
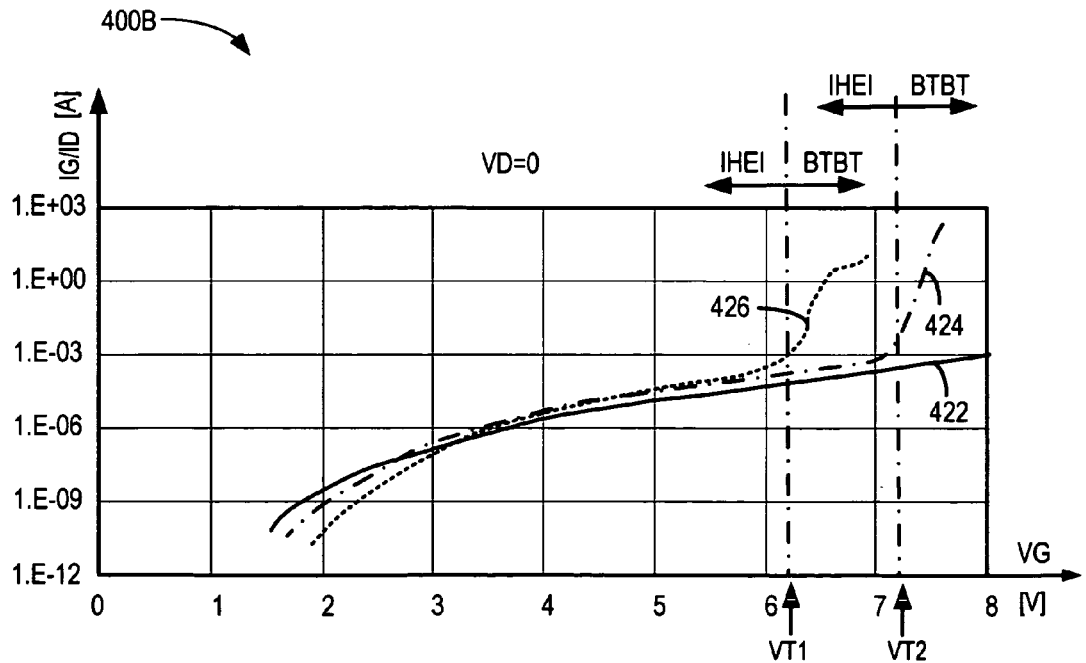
FIG. 4B shows a graph of ratios of measured gate currents versus measured drain currents of the exemplary regular PMOS transistor resulting from impact ionization and BTBT within the transistor's conductive channel.

FIG. 4B shows graph 400B, ratios of measured gate currents (IG) versus measured drain currents (ID) of the exemplary regular PMOS transistor resulting from impact ionization and BTBT within a conductive channel of the transistor. Plots 422, 424, and 426 show ratios of gate-currents versus drain-currents using the same measurement data as used in FIG. 4A. Note the differences in injection efficiencies as measured by these ratios. When BTBT injection exist, i.e. regions where VG is larger than a particular VT, the BTBT injection is a thousand times more efficient than IHEI. The obtained measurement results suggest that using BTBT as a main injection mechanism can lower ID requirements of the NVM cell, consequently allows the use of a much smaller charge pump.

Figure 5:
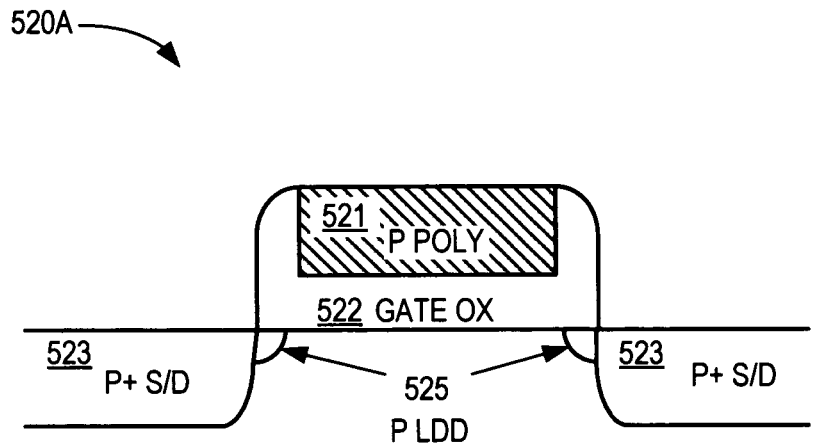
FIG. 5 shows an exemplary cross-section of the high voltage PMOS device Q1 of FIG. 3A.
Figure 6:
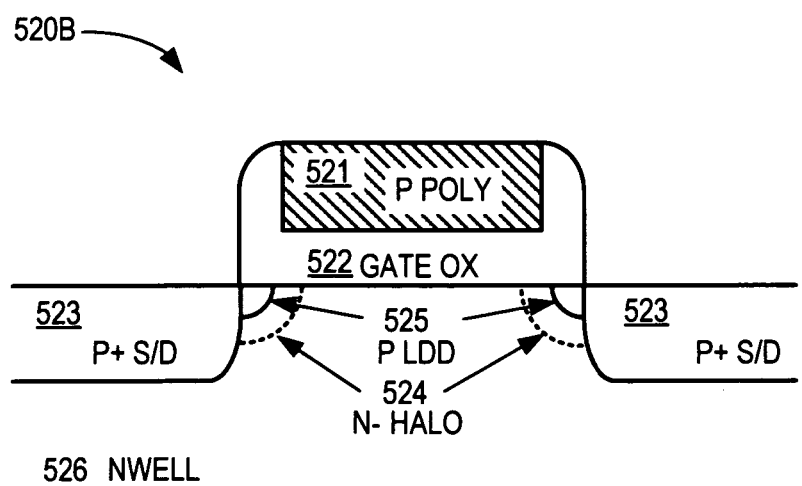
FIG. 6 shows an exemplary cross-section of the regular enhanced PMOS BTBT device Q2 of FIG. 3A.

FIG. 5 shows exemplary cross-section 520A, of the PMOS device Q1, while FIG. 6 shows exemplary cross-section 520B of the regular enhanced PMOS BTBT device Q2 of FIG. 3A, FIGS. 5, and 6 show how BTBT device Q2 may be made to have more dopant atoms than transistor Q1. BTBT device Q2 has more features in its dopant profile than transistor Q1. Both transistors Q1 and Q2 are shown to have P+ doped source/drain 523, and lightly doped drain (P LDD) implants 525. However, BTBT device Q2 has a higher density of a P dopant concentration of approximately $10^{20}$ atoms/cm$^3$ versus $10^{19}$ atoms/cm$^3$ for transistor Q1. BTBT device Q2 has halos 524 with an N− dopant concentration of $10^{18}$ atoms/cm$^3$; however, transistor Q1 does not. The described differences make BTBT device Q2 an efficient injection device.

According to an embodiment, NVM cell 311 of FIG. 3 is constructed from "I/O" transistors, which are different from core logic transistors (not shown) of the semiconductor die (chip) in which the NVM cell 311 is constructed. Transistors Q1 and Q2 have thicker gate dielectrics 522, approximately 70 A, a typical value for a 3.3V device, than the core logic transistors, which have gate dielectrics thickness of approximately 20 A, a typical value for a 1.2V device. NVM cells are constructed from these "I/O" transistors because high voltages are used at source/well 312 electrode and at Tun. line 313 to induce the respective high-energy electron injection and FN tunneling mechanisms. The thicker gate oxide is used to increase floating gate NVM retention.

The rest of the features are the same for both transistors Q1 and BTBT device Q2. They are built in N-Well 526 with a dopant concentration of $10^{17}$ atoms/cm$^3$ and have a dopant concentration of approximately $10^{20}$ atoms/cm$^3$ for source drain region 523. Transistor Q1 and BTBT device Q2 employ similar P Poly gates 521.

Figure 7A:
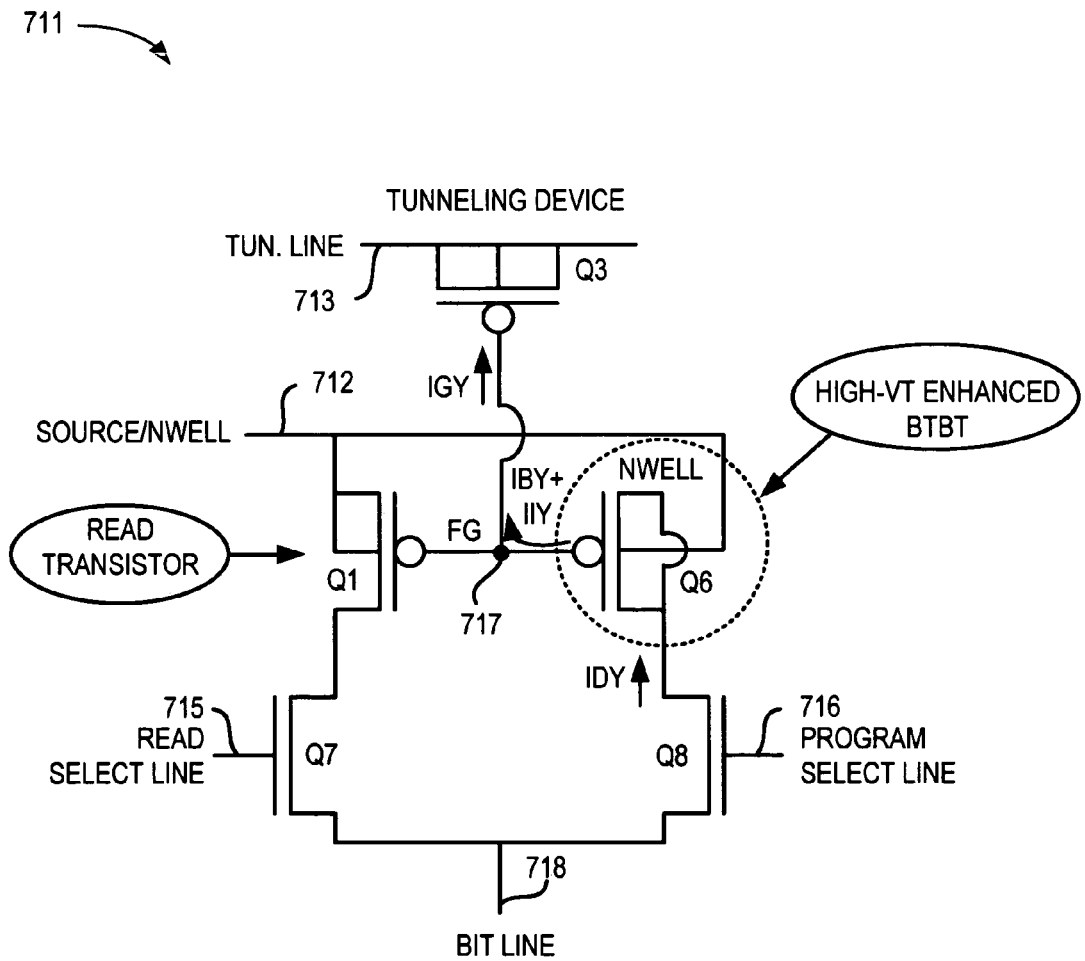
FIG. 7A depicts a NVM circuit utilizing a High Threshold Voltage (High-VT) enhanced BTBT device according to an embodiment.

FIG. 7A shows a schematic diagram of Non-Volatile Memory (NVM) cell 711 that utilizes a High Threshold Voltage (High-VT) enhanced BTBT device according to an embodiment. NVM cell 711 shows many structural and operational similarities to that of NVM cell 311 of FIG. 3A with three very notable differences.

BTBT device Q6 is a High-VT BTBT device while BTBT device Q2 of cell 311 is a regular enhanced BTBT device. Differences between a High-VT BTBT device and a regular enhanced BTBT device are described later in the text.

BTBT device Q6 is configured to inject charge onto the floating gate using band-to-band tunneling induced current IBY only. It is incapable of transporting currents by IHEI because its drain and source nodes are configured to be at the same electrical potential. It should be noted, if potentials are high enough FN tunneling can occur, this requires Vg to be much higher that Vd.

Transistor Q1, although shares FG 717 with BTBT device Q6, does not provide any charges to FG 717 because transistor Q7 is in accumulation during program operation. By preventing transistor Q1 from influencing a charge level on FG 717 and by using BTBT as the sole means of charge control allows a finer control over the charge level on FG 717.

Finer control of the charge level makes it possible to use NVM cell 711 as a multi level storage device. Further discussion on the multi level storage device is provided later in the text.

A pair of select transistor Q7 and Q8 is coupled serially with read-transistor Q1 and BTBT device Q6 respectively. Transistor Q7 provides current (when enabled) to read-transistor Q1. Transistor Q8 provides current (when enabled) to BTBT device Q6.

During a program operation, a high voltage, a voltage high enough to cause BTBT when gate voltage Vg>VT and drain voltage Vd is close to 0V is applied to electrode 712 to bias the BTBT device and trigger a BTBT in device Q6. Program select line 716 is set high to turn on transistor Q8 during the program operation only while BIT line 718 is pulled to or close to 0V. The applied voltage creates a high intensity electric field, which severely bends an energy band in the N-Well of BTBT device Q6 that results in a BTBT in a drain/N-Well diode. Due to the influence of the high intensity electric field, electrons in the valence band tunnel into the conduction band and the holes left behind travel to the drain. Here electrons are accelerated toward the channel region by a lateral field, and may gain enough energy to travel across a SiO2 barrier to FG 717. Thus, in this manner, BTBT device Q6 injects high-energy electrons onto FG 717. The injected amount of charge (i.e. electrons) on FG 717 is determined by the bias voltage. During the programming operation, the bias voltage is controlled such that the BTBT device is in accumulation. BTBT stops as soon as a channel is formed and there is no longer a reversed bias diode junction.

BTBT device Q6 is designed to have a high intensity electric field beneath and near the edges of its gate, due to the presence of a high density of acceptor atoms near its drain regions. These high density of acceptor atoms result in the flux lines of high intensity electric field flux in BTBT device Q6 terminating close to the surface of the substrate beneath the gate dielectric. This results in severe energy band bending in the drain regions of BTBT device Q6 toward the gate inducing a substantial BTBT within the drain regions of device Q6. It should be noted, BTBT device Q6 is in accumulation during BTBT tunneling. No conductive channel is formed in the source of BTBT device Q6 because the voltage on FG 717 is too high with respect to the voltage of the source. During a read operation, program select line 716 may be held low to turn off transistor Q8, thereby preventing BTBT device Q6 from injecting any band-to-band tunneling current onto floating gate 717, and disturbing the read operation. Meanwhile read select line 715 is held high to turn on transistor Q7, which provides a current path to read-transistor Q1.

During an unselected program operation, where a different FG that shares the same BIT line 718 is being programmed, program select line 716 is held low to turn off transistor Q8 and shield BTBT device Q6 from having a high electric field between its well and drain. As such, program select line 716 may be driven by logic circuitry that indicates whether the memory cell is selected and it is in a read mode or in some other state. FG 717 that shares common source/nwell 712 can be selectively program by having different BIT line 718 voltages. To inject electrons onto the FG 717 BIT line 718 is held at 0V. To avoid injecting elections on the FG 717 the bit line is held at a higher voltage e.g., between 0V and a voltage on source/nwell electrode 712.

In order to erase NVM cell 711 and put it into logic state "0" or "00", electrons are removed from FG 717. That effectively increases the charge on FG 717 beyond a charge threshold, which corresponds to the desired logical state. During this process, electrons are tunneled by a FN tunneling mechanism from FG 717 into a semiconductor substrate portion of tunneling-device Q3. In case of FN tunneling, a large positive voltage is applied onto Tun. line 713 to create a strong electric field that runs from the semiconductor substrate portion of tunneling-device Q3 to FG 717. This large positive voltage causes the bending of the energy band structure of the gate dielectric of tunneling-device Q3 that promotes the tunneling of electrons through the energy barrier between FG 717 and the semiconductor substrate portion of tunneling-device Q3. To aid in creating the high voltage across device Q3, the other device are held at a low voltage ~0V.

Figure 7B:
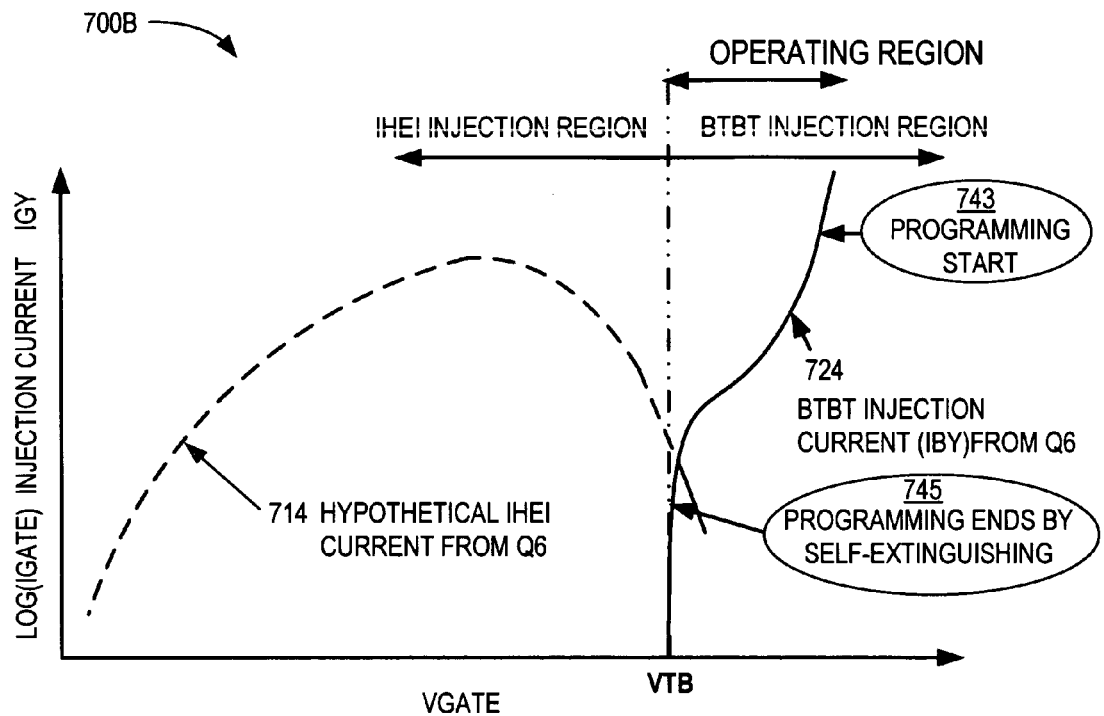
FIG. 7B is a graph showing an operating region for the NVM circuit of FIG. 7A and indicates possible contributions to a gate electrode current from both an impact ionization current component and a band-to-band-tunneling current component from BTBT device Q6.

FIG. 7B is graph 700B that shows an operating region of NVM circuit 711 of FIG. 7A and indicates possible contributions to gate electrode current IGY from both IHEI current component IIY 714 and BTBT current component IBY 724 from BTBT device Q6. Graph 700B is divided in two regions along a horizontal axis at a value of VTB, which is the threshold voltage of BTBT device Q6. They are a BTBT injection region right of VTB and an IHEI region left of VTB. NVM cell 711 operates in the BTBT region, where charges are moved onto FG 717 by BTBT current IBY 724. Programming starts at a gate voltage level indicated by note 743. Programming stops when IBY self extinguishes when VG becomes equal to VTB as indicated by note 745.

The IHEI region includes a hypothetical injection current IIY 714. IHEI current IIY 714 cannot develop within the present cell configuration because drain and source nodes of BTBT device Q6 are shorted together and they cannot provide or sink any source-to-drain or drain-to-source currents.

Figure 7C:
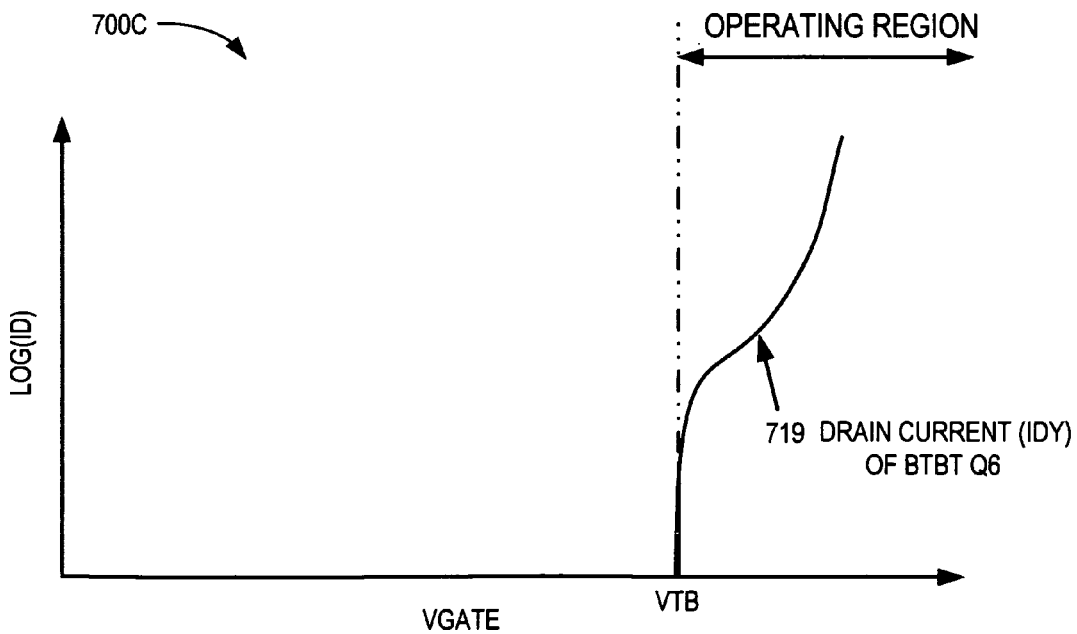
FIG. 7C is a graph showing a drain current of BTBT device Q6 of FIG. 5A in the operating region.

FIG. 7C is graph 700C that shows drain current IDY 719 of device Q6 of FIG. 7A. In the operating region, drain current IDY 719 has the same value as injection current IBY 724.

Figure 8A:
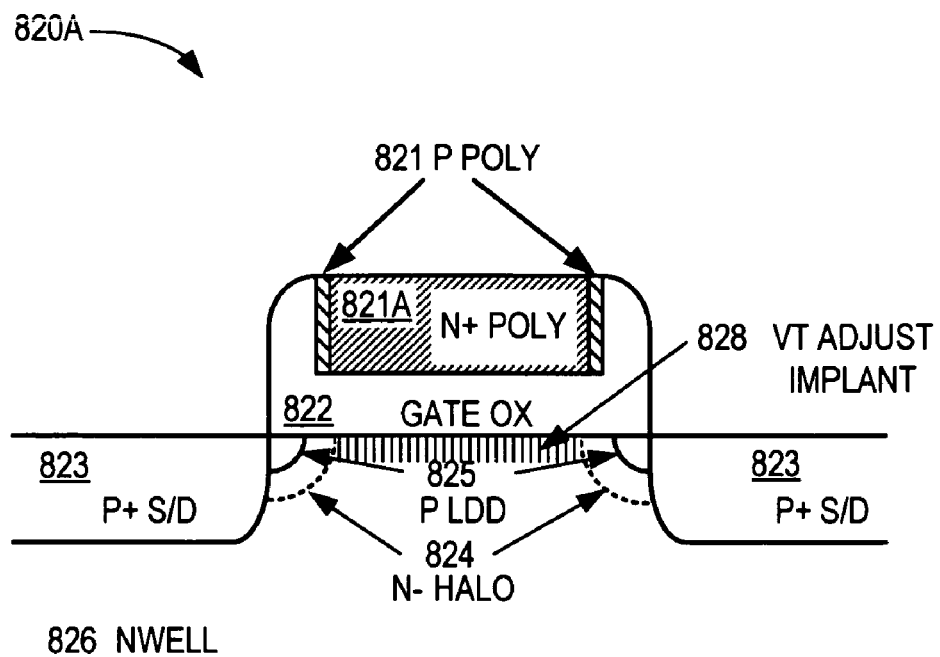
FIG. 8A shows an exemplary cross section of the High-VT enhanced BTBT device Q6 of FIG. 7A according to an embodiment.

FIG. 8A shows cross-section 820A of the High-VT enhanced BTBT device Q6 of FIG. 7A according to an embodiment. BTBT device Q6 shares many features with BTBT device Q2 of FIG. 3A and FIG. 6. In addition to the shared features, BTBT device Q6 has some additional features, which raise its VT by at least 300 mV. Having its VT 300 mV higher than a VT of read-transistor Q1 makes device Q6 well suited for BTBT programming. These features include VT adjust implant 828 and N+ doped poly gate 821A. It should be noted, a small part 821 of the gate of BTBT device Q6 is still doped with P-type impurities. Optionally, LDD implant 825 can be skipped if the P+S/D implant 823 overlap the gate, this may increase the gradient of the field.

Figure 8B:
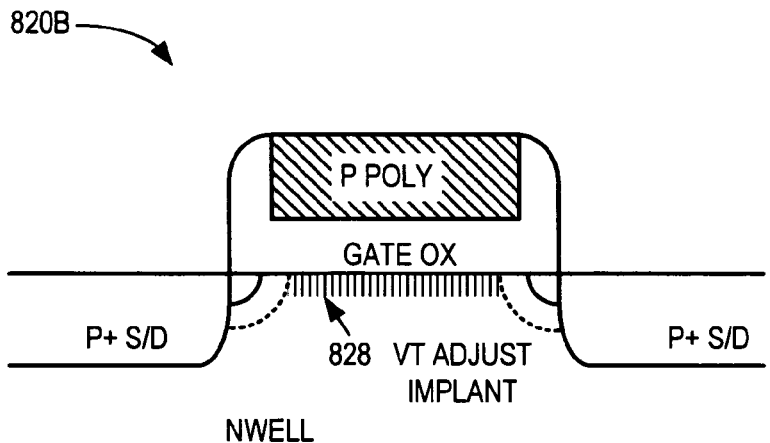
FIG. 8B shows an exemplary cross section of a High-VT enhanced BTBT device with a threshold adjust implant according to an embodiment.

FIG. 8B shows cross-section 820B of High-VT enhanced BTBT device Q6 according to an embodiment. In this embodiment, only threshold-adjust implant 828 is implemented as a High-VT enhancement feature.

Figure 8C:
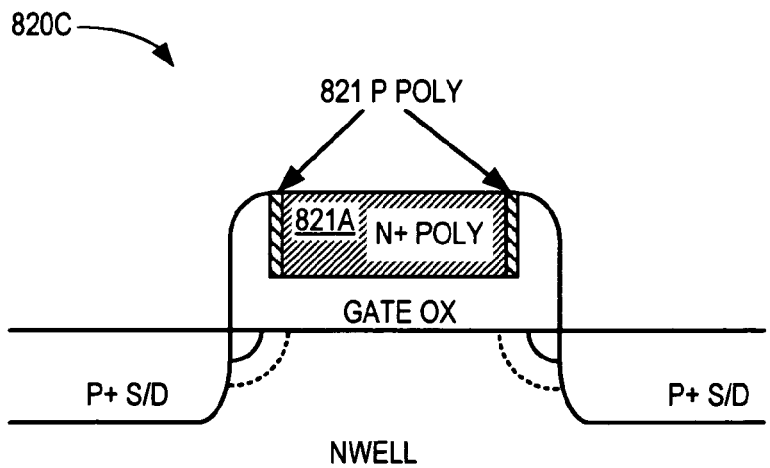
FIG. 8C shows an exemplary cross section of a High-VT enhanced BTBT device with an N+ Poly gate according to an embodiment.

FIG. 8C shows cross-section 820C of High-VT enhanced BTBT device Q6 according to an embodiment. In this embodiment, only N+ doped poly gate is implemented as a High-VT enhancement feature.

Figure 9A:
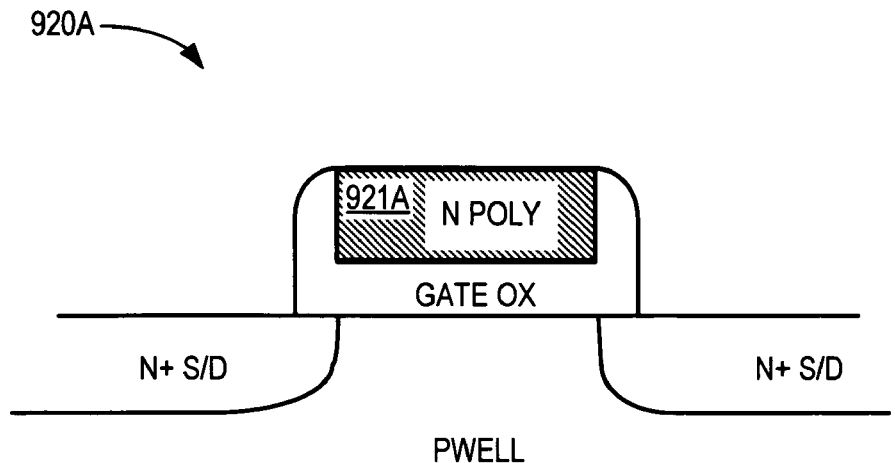
FIG. 9A shows an exemplary cross section of an enhanced BTBT NMOS device with a heavily doped N+ gate without a LDD implant according to an embodiment.

FIG. 9A shows cross-section 920A of an enhanced BTBT NMOS device according to an embodiment. In this embodiment only heavily doped N poly gate 921A is implemented as a High-VT enhancement feature.

Figure 9B:
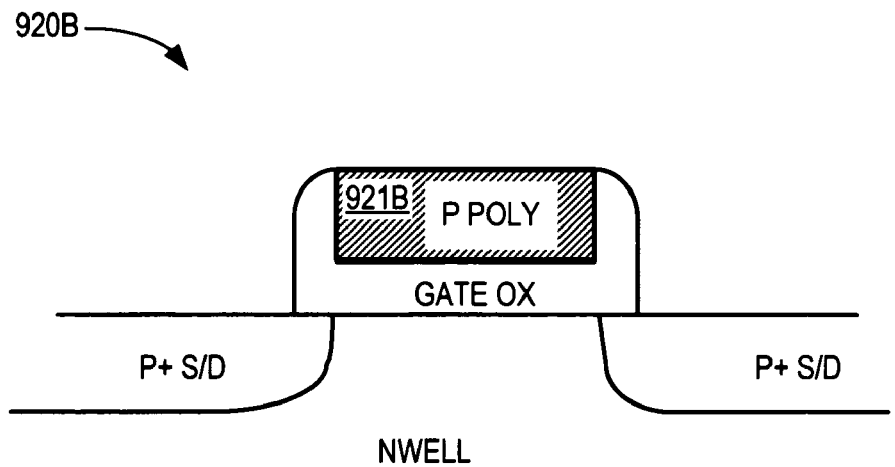
FIG. 9B shows an exemplary cross section of an enhanced BTBT PMOS device with a heavily doped P+ gate without a LDD implant according to an embodiment.

FIG. 9B shows cross-section 920B of an enhanced BTBT PMOS device according to an embodiment. In this embodiment only heavily doped P poly gate 921B is implemented as a High-VT enhancement feature.

Figure 9C:
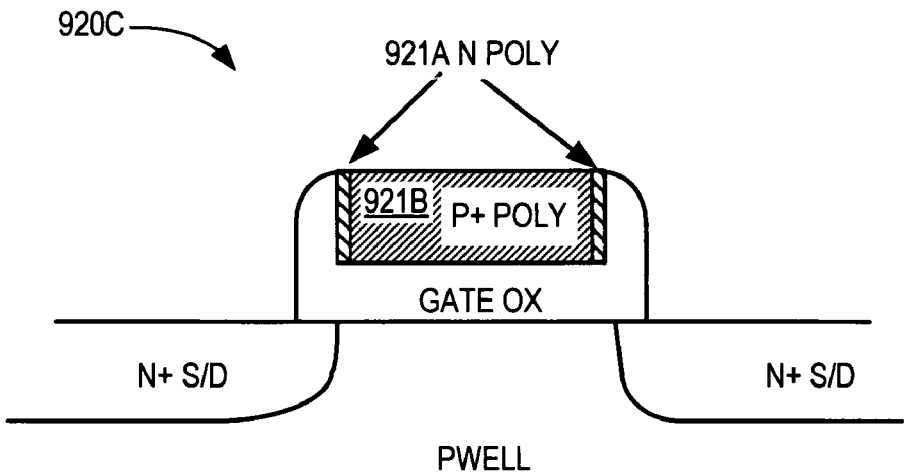
FIG. 9C shows an exemplary cross section of a High-VT enhanced BTBT NMOS device with a heavily doped P+ gate without a LDD implant according to an embodiment.

FIG. 9C shows cross-section 920C of a High-VT enhanced BTBT NMOS device according to an embodiment. In this embodiment only heavily doped P poly gate 921B is implemented as a High-VT enhancement feature.

Figure 9D:
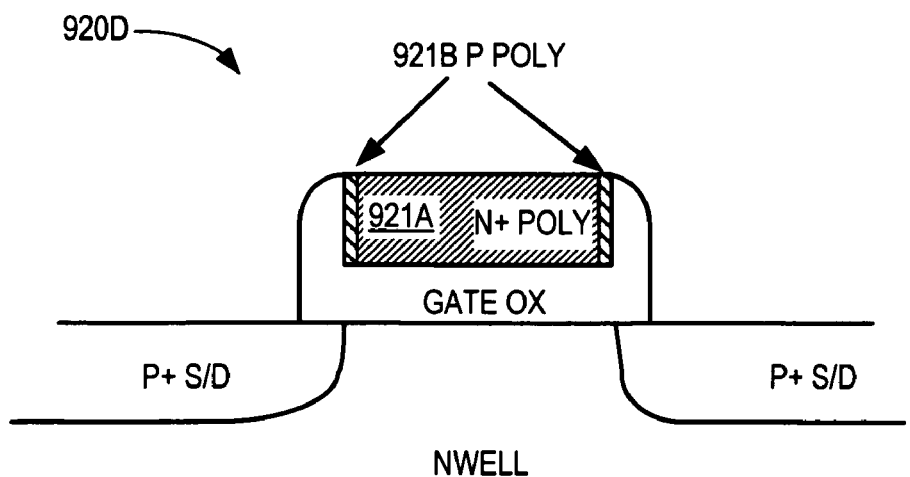
FIG. 9D shows an exemplary cross section of a High-VT enhanced BTBT PMOS device with a heavily doped N+ gate without a LDD implant according to an embodiment.

FIG. 9D shows cross-section 920D of a High-VT enhanced BTBT PMOS device according to an embodiment. In this embodiment only heavily doped N poly gate 921A is implemented as a High-VT enhancement feature.

Figure 10:
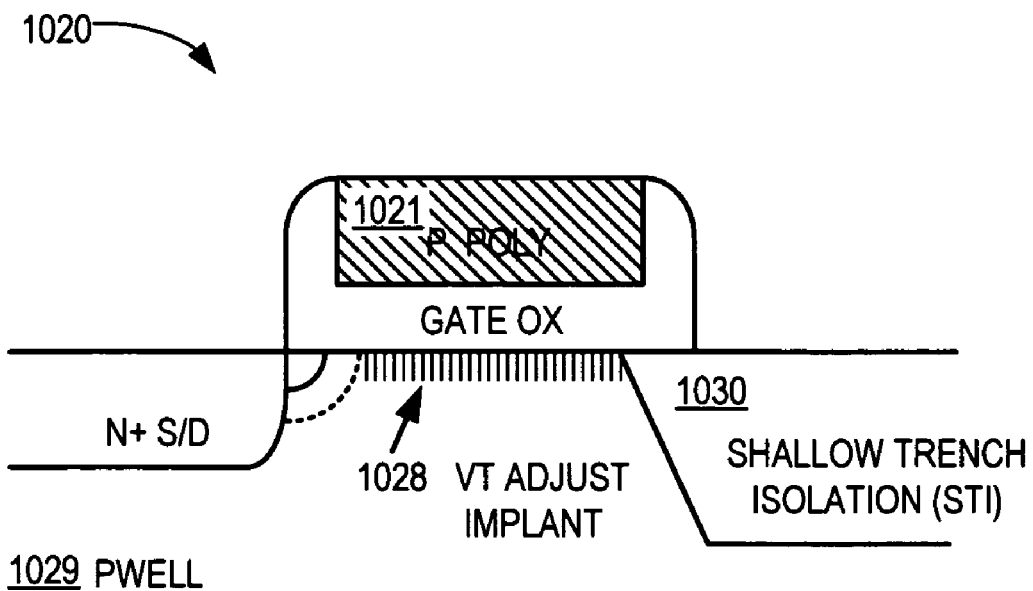
FIG. 10 shows an exemplary cross section of a High-VT enhanced BTBT device NMOS device without a source implant according to an embodiment.
Figures 19A, 19B:
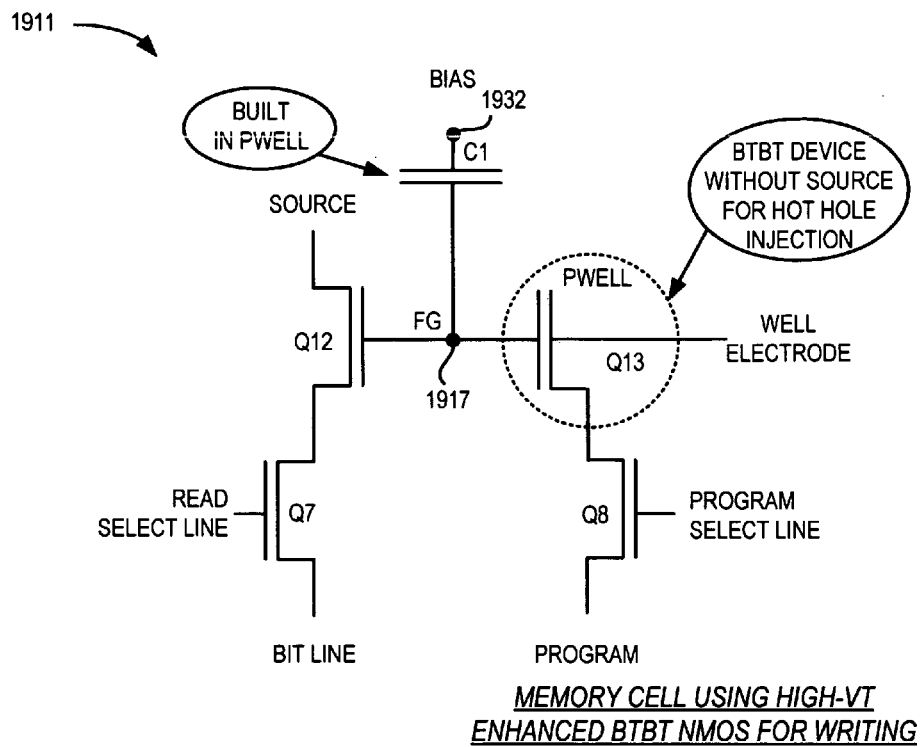
FIG. 19A is schematic diagram of a NVM cell circuit utilizing a High-VT enhanced NMOS BTBT device without source implant for writing according to an embodiment.
FIG. 19B is a table showing ML programming conditions for the NVM cell of FIG. 19A according to an embodiment.

FIG. 10 shows cross-section 1020 of a High-VT enhanced NMOS BTBT device Q13 of FIG. 19A according to an embodiment. BTBT device is built in a P-Well 1029. In the embodiment VT adjust implant 1028 and P doped poly gate 1021 are implemented as High-VT enhancement features.

BTBT device Q13 is without a source implant but has shallow trench isolation plug 1030 in its place. This feature prevents IHEI from occurring on this device.

It is noteworthy, that BTBT devices discussed in relation to FIGS. 8A through 10 can also be implemented with devices of a complementary doping polarity.

FIG. 11A shows table 1150A of control voltage levels that are applied to the NVM cell 311 of FIG. 3A during operations. Where VDD_L stands for a supply voltage of the core logic, with a value at 1.2 V for a typical 90 nm process node, and VDD_IO stands for a supply voltage of the IO circuits, with a value of 3.3 V. The value of VDD_L changes with various technology nodes (i.e. 65 nm vs. 0.18 um) and process options. Some technology nodes have two other process options. For example, at 65 nm node there can be lower power option with VDD_L=1.2 V and a high performance option with VDD_L=0.9 V. Similarly, the VDD_IO may have different options; it may be possible to choose between 2.5V, 3.3V, or 5V IO devices. To make the examples more general, some of the voltage levels are referenced to VDD_L and VDD_IO.

FIG. 11B shows table 1150B of control voltage levels that are applied to the NVM cell 711 of FIG. 7A during operations. Where VTUN stands for a tunneling voltage, with a value between 9-12 V for a typical 3.3V device. It should be noted that the specific voltages given in relationship with FIGS. 11A and 11B are representative values for a "130 nm" CMOS technology.

Figure 12A:
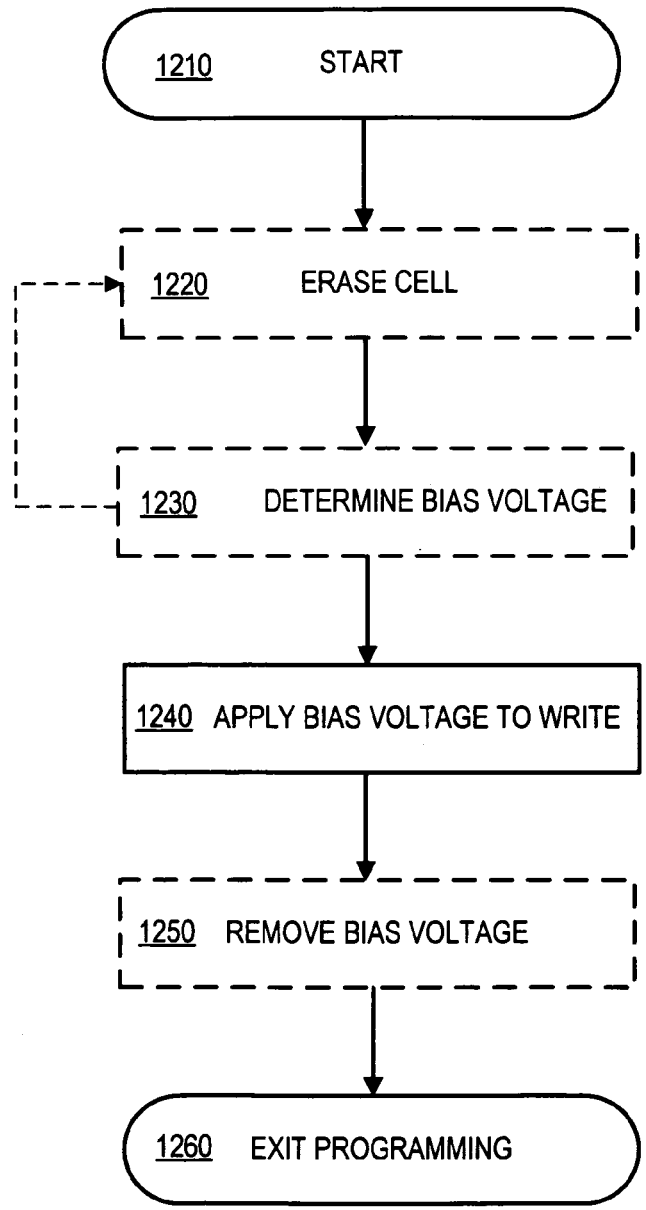
FIG. 12A is a flow chart illustrating a method of programming a NVM cell with the High-VT enhanced BTBT device according to embodiments.

FIG. 12A is a flow chart that illustrates method 1200 of programming a PMOS NVM cell with the High-VT enhanced BTBT device according to embodiments.

At operation 1210, programming starts.

At optional next operation 1220, the NVM cell is erased. It should be noted, if the FG has previously be programmed with a state more negative than the desired state an erase operation is needed, the erasing operation uses FN tunneling for removing charges from the FG. This operation is needed since BTBT injection in general only add charges onto the FG.

At optional next operation 1230, it is determined what bias voltages should be applied to charge the FG to a required level. For example in a multiple level programming scheme where charges can be moved onto and removed from the FG by BTBT injection the temporal charge level of FG is required to complete a write operation. When it is determined that charges need to be removed from the FG the method may loop back to operation 1220

Next, at operation 1240, bias voltages are applied to the NVM cell in order to perform the write operation. More detail of this operation is provided in the text below.

At optional next operation 1250, at completion of the write operation, bias voltages are removed from the NVM cell.

At operation 1260, the programming is complete.

Figure 12B:
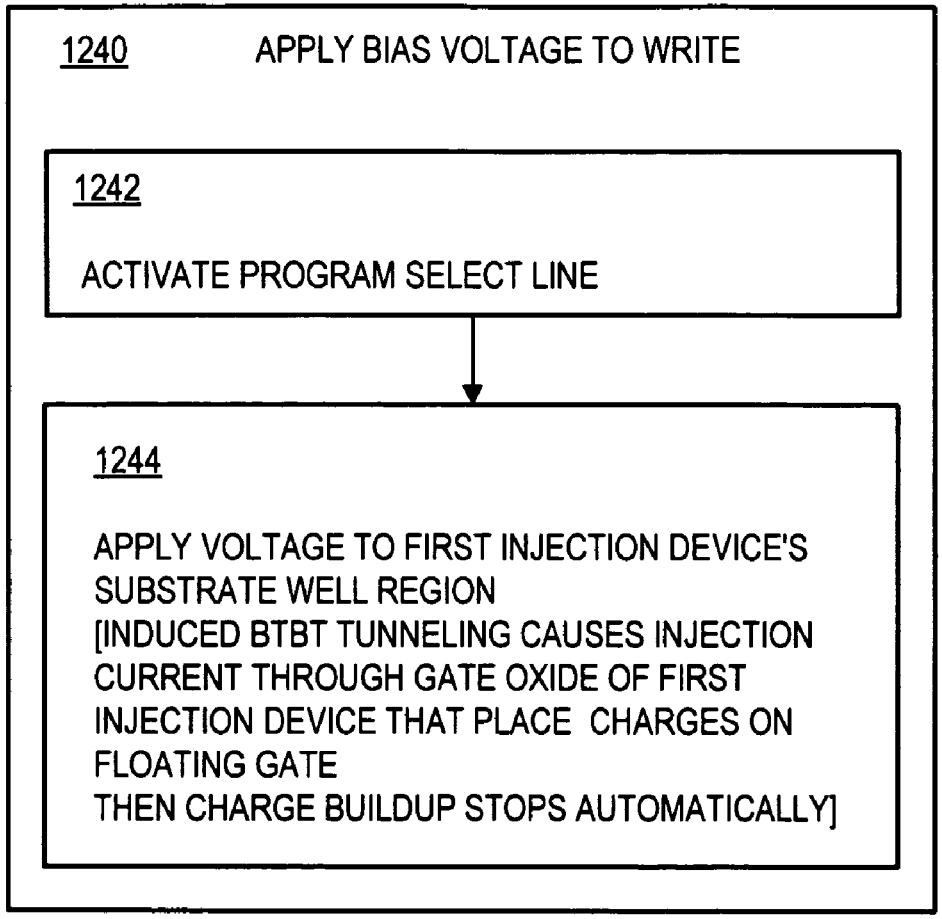
FIG. 12B illustrates a method of writing to a floating gate with the High-VT enhanced BTBT device according to embodiments.

FIG. 12B illustrates method 1240 of writing onto a floating gate with a High-VT enhanced BTBT device according to embodiments.

At operation 1242, program select line is activated to provide a current path to control the drain of the BTBT device.

At operation 1244, a bias voltage is applied to the well region of the BTBT device via source/nwell electrode, the bias voltage is higher than a potential difference between the FG and the well region of the BTBT device. The potential difference is chosen that it remains large enough to keep the BTBT device in accumulation. The applied voltage induces a BTBT that causes a flow of injection current through gate oxide of the BTBT device creating a charge build up on the FG. The charge build up is a self-extinguishing process, it stops automatically when a depletion region is formed in the BTBT device. There is no need to check the voltage on the floating gate. The amount of charge injected on the floating gate is set by biasing conditions and it is substantially independent of a duration of an application of the bias voltage. There is no need for iterations of charge-transfer to and from the floating gate.

Figure 13:
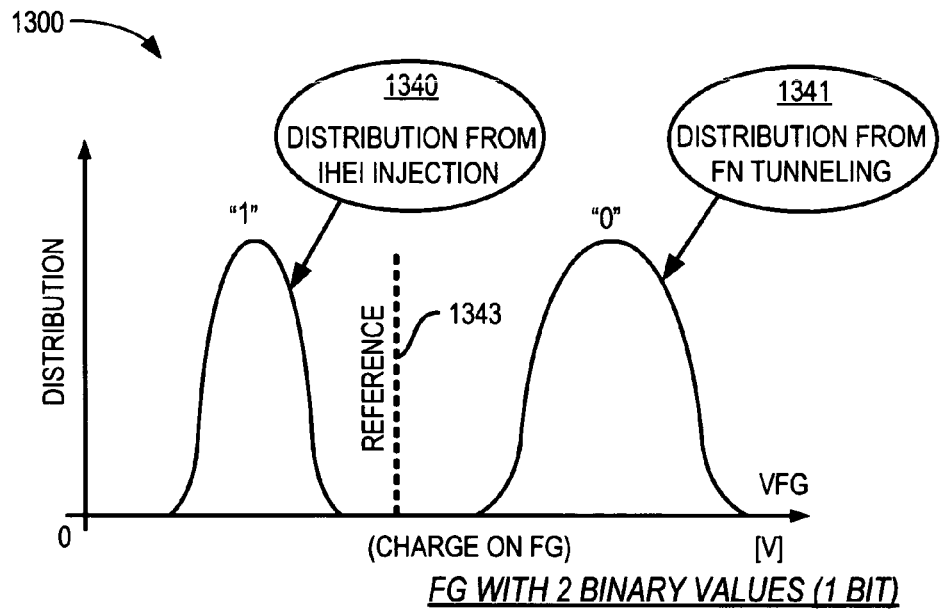
FIG. 13 is a graph showing a charge distribution on a floating gate for binary value according to prior art.

FIG. 13 is graph 1300 that shows a charge distribution on a FG for binary value according to prior art. Graph 1300 shows charge distribution as a function of a FG voltage. Graph 1300 represents a scenario where logic "0" is represented by an absence of electrons on the FG, while logic "1" is represented by a presence of electrons on the FG. Stating it differently, FG voltage smaller than one indicated by Reference 1343 represents logic "1", and FG voltage larger than indicates by reference 1343 represents logic "0". Graph 1300 further demonstrates the influence of injection methods on the shape of charge distributions. The shape of a charge distribution 1340 from IHEI is narrower than the shape of a charge distribution 1341 of FN tunneling.

Figure 14A:
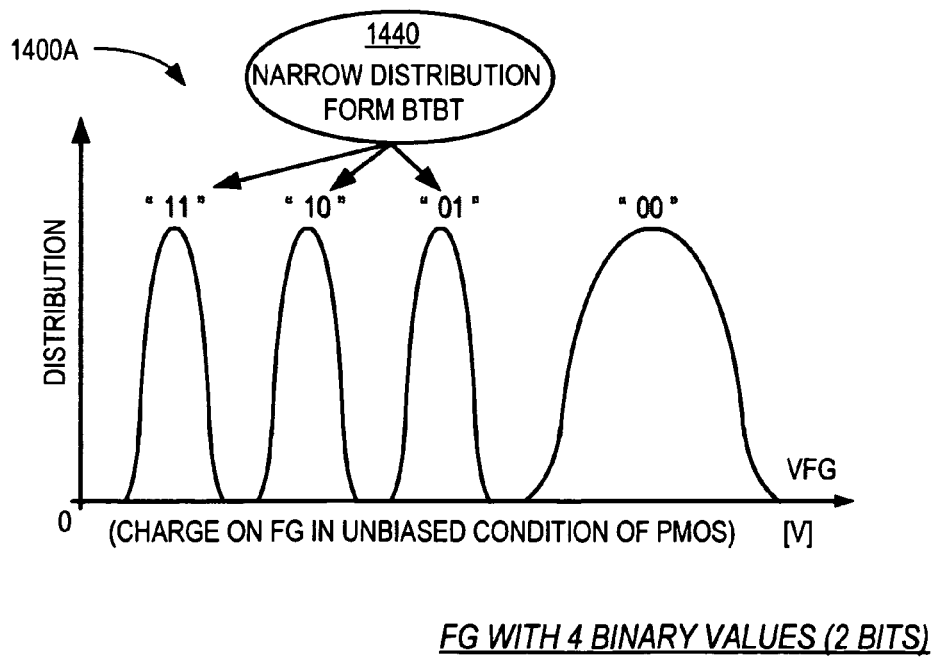
FIG. 14A is a graph showing charge distributions on a floating gate for 2 bits Multi-Level (ML) values according to an embodiment.

FIG. 14A is graph 1400A that shows charge distributions on the FG for a 2 bits, ML-values NVM cell according to an embodiment. Graph 1400 shows charge distribution as a function of voltage on the FG. Graph 1400 represents a scenario where the FG of a NVM cell is part of a PMOS device. The NVM cell can denote four logic values. Logic "0" is represented by the absence of electrons on the FG, while logic "01", "10" and "11" are represented by ever increasing amounts of electrons on the FG. Graph 1400 further demonstrates the influence of injection methods on the shape of charge distributions. Shapes of charge distributions 1440 from BTBT are noticeably narrower than the shape of a charge distribution from FN tunneling. Narrower charge distribution is one of the factors that allow the NVM cell to denote multiple logic values. By precisely controlling the widths of the charge distributions, the NVM cell can denote eight or more logic values.

Figures 14B, 15:
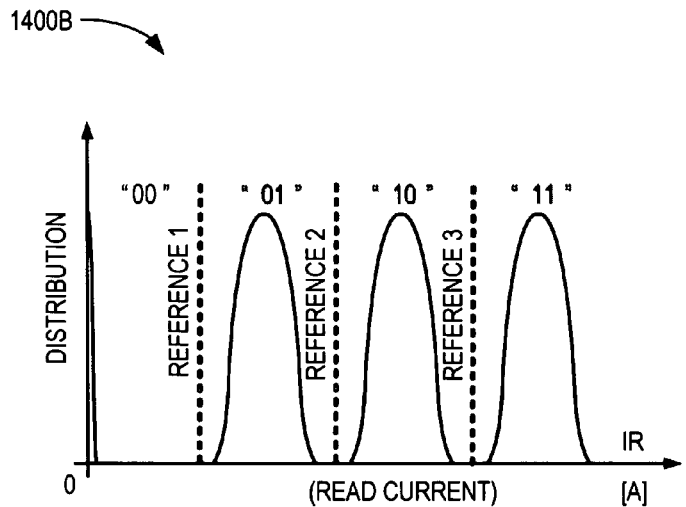
FIG. 14B is a graph showing read current distributions of a 2 bits ML memory according to an embodiment.
FIG. 15 is a table showing ML programming conditions for the NVM cell of FIG. 7A according to an embodiment.

FIG. 14B is graph 1400B that shows and example of read current distributions of a 2 bits ML NVM cell according to an embodiment. Graph 1400B shows how different read current values are interpreted by a sense amplifier of a ML NVM memory device. Current values below Reference1 are interpreted as logic values "00", currents between Reference1 and Reference2 as logic "01", currents between Reference2 and Reference3 as logic "10", and currents above Reference3 as logic "11". In logic state "00", the FG is hard off, in logic state "01" the FG is slightly on, in logic state "10" the FG is on, and in logic state "11" the FG is hard-on.

FIG. 15 is table 1550 that shows ML programming conditions for the NVM cell of FIG. 7A according to an embodiment. The first column of table 1550 shows the nature of the operations during programming, the second column indicates the logic value equivalent of the stored charge on the FG 717 of FIG. 7A, while the rest of the columns show the values of the applied control signals. V1 through V7 represent ever-increasing voltage levels. Actual voltage levels are a function of the particular process technology used to build the NVM cell. It should be noted, programming could only progress from a lower logic value to a higher one. For instance, logic "11" can be written in a NVM cell which holds charges that represents logic "10", however to write logic "01" the cell needs to be erased first. The above mentioned programming order does not mean that more than one write operation is needed to go from the lowest logic value to the highest.

Figures 16A, 16B:
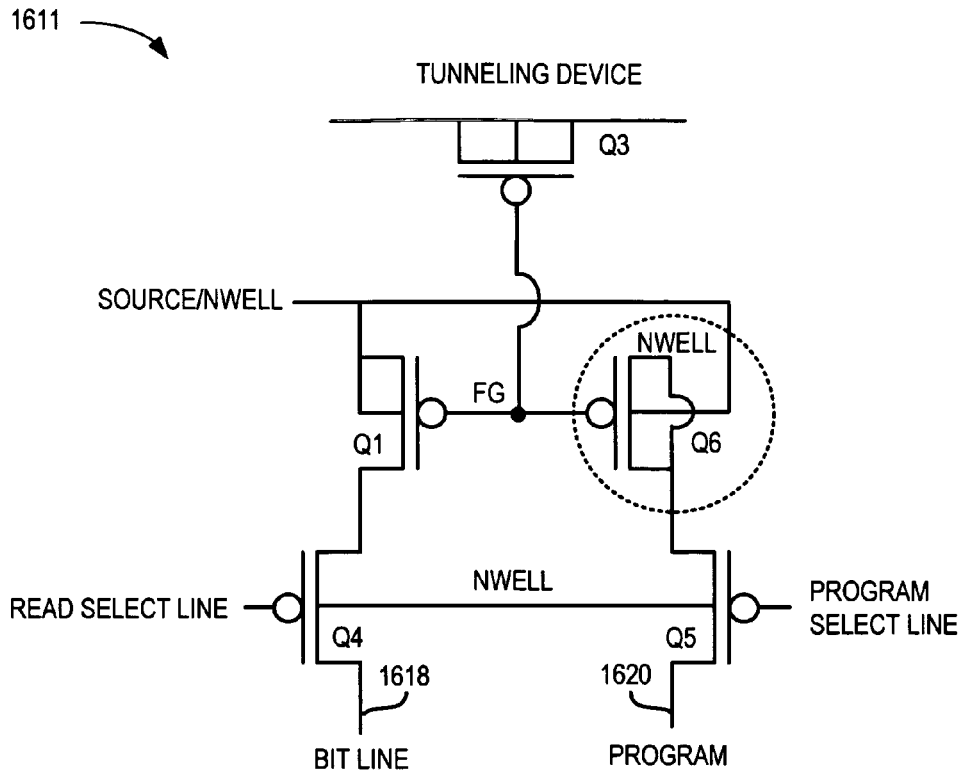
FIG. 16A is schematic diagram of a NVM cell circuit utilizing a High-VT enhanced PMOS BTBT device for writing according to an embodiment.
FIG. 16B is a table showing ML programming conditions for the NVM cell of FIG. 16A according to an embodiment.

FIG. 16A shows a schematic diagram of NVM cell 1611 according to an embodiment. NVM cell 1611 operates similarly to NVM cell 711. The two cells are also structurally similar with two notable differences. NVM cell 1611 employs PMOS transistors Q4 and Q5 whereas NMOS transistors Q7 and Q8 are used in NVM cell 711. Furthermore, Bit line 1618 is now separated from the program line 1620.

FIG. 16B is table 1650 that shows ML programming conditions for NVM cell 1611 according to an embodiment. Interpretations of data are the same as in table 1550.

Figures 17A, 17B:
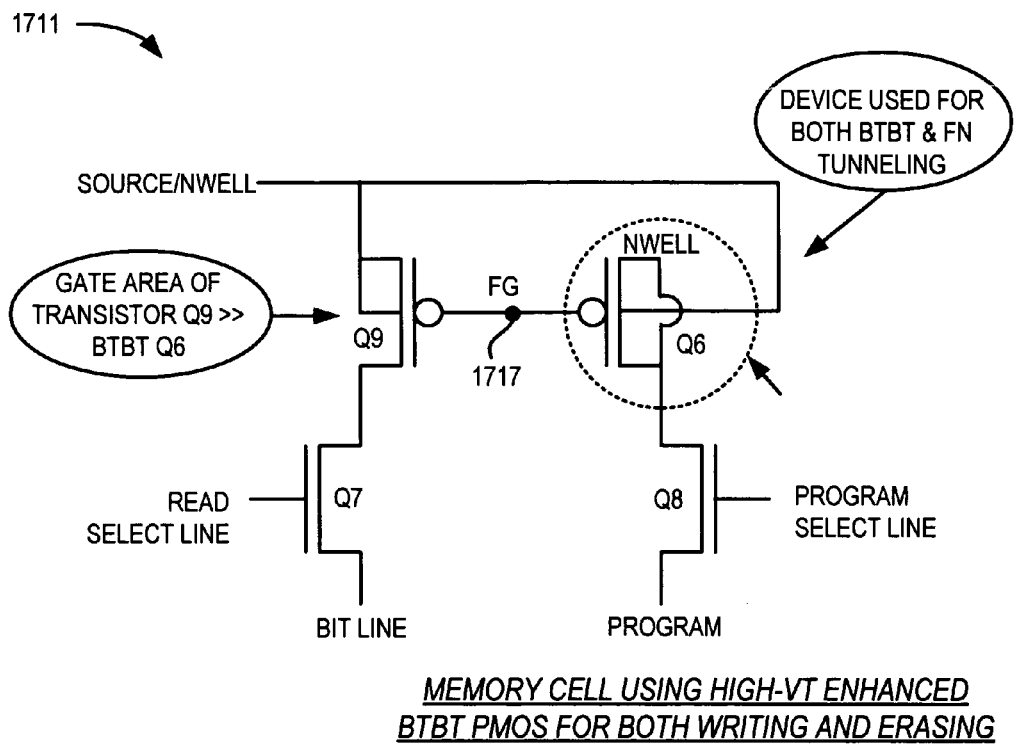
FIG. 17A is schematic diagram of a NVM cell circuit utilizing a High-VT enhanced PMOS BTBT device for both writing and erasing according to an embodiment.
FIG. 17B is a table showing ML programming conditions for the NVM cell of FIG. 17A according to an embodiment.

FIG. 17A shows a schematic diagram of NVM cell 1711 according to an embodiment. NVM cell 1711 is a modified version of NVM cell 1611. The two cells are structurally similar with two notable differences. NVM cell 1711 does not have a tunneling device like tunneling-device Q3. Furthermore, a gate area of read device Q9 is much larger than a gate area of BTBT device Q6. The difference operationally between the two cells is due to the lack of the tunneling device in NVM cell 1711. Here BTBT device Q6 is now used for both writing onto, and removing charges from FG 1717.

FIG. 17B is table 1750 that shows ML programming conditions for NVM cell 1711 according to an embodiment. Interpretations of data are the same as in table 1550. In addition, VT1 and VT2 here represent threshold voltages of transistor Q7 and Q8 respectively.

Figures 18A, 18B:
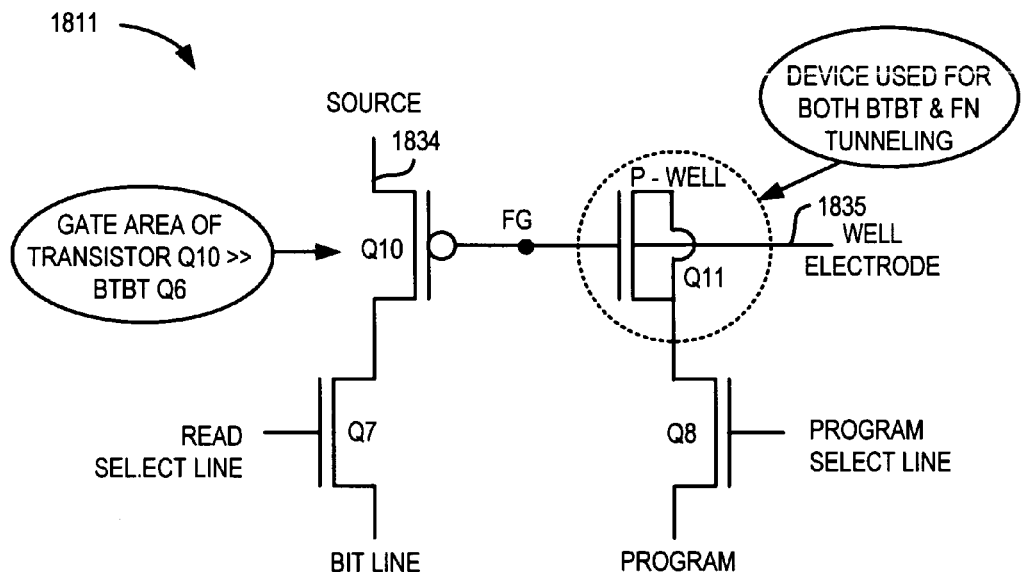
FIG. 18A is schematic diagram of a NVM cell circuit utilizing a High-VT enhanced NMOS BTBT device for both writing and erasing (BTBT and Fowler-Nordheim tunneling) according to an embodiment.
FIG. 18B is a table showing ML programming conditions for the NVM cell of FIG. 18A according to an embodiment.

FIG. 18A shows a schematic diagram of NVM cell 1811 according to an embodiment. NVM cell 1811 is a modified version of NVM cell 1711. The two cells are structurally similar with two notable differences. BTBT device Q1 is a NMOS device while BTBT device Q6 of NVM cell 1711 is a PMOS device. Furthermore, source 1834 of read-transistor Q10 and well electrode 1835 of BTBT device Q6 no longer are connected to each other. Operationally the two cells are similar.

FIG. 18B is table 1850 that shows ML programming conditions for NVM cell 1811 according to an embodiment. Interpretations of data are the same as of table 1750.

FIG. 19A shows a schematic diagram of NVM cell 1911 utilizing a High-VT enhanced NMOS BTBT device Q13 without source region according to an embodiment. Device Q13 is fabricated in a similar fashion to the device shown in FIG. 10. NVM cell 1911 can be considered a modified version of NVM cell 1811. The two cells are similar structurally with three notable differences. BTBT device Q13 does not have a source region. The gate area size of the read-transistor is now similar to the gate area size of BTBT device Q13. Furthermore bias capacitor C1, which is built in an N-Well, is coupled to FG 1917. Operational behavior of the two cells are similar with one exception, the voltage level on FG 1917 can be adjusted by the application of a bias voltage at node 1932 to bias-capacitor C1 during the write operation.

FIG. 19B is table 1950 that shows ML programming conditions for NVM cell 1911 according to an embodiment. Interpretations of data are the same as of table 1750.

FIG. 20A is a schematic diagram of a NVM cell circuit utilizing High-VT enhanced NMOS BTBT and BTBT PMOS devices according to an embodiment.

FIG. 20A shows a schematic diagram of NVM cell 2011 utilizing a pair of complementary High-VT enhanced BTBT devices, PMOS BTBT device Q6 and NMOS BTBT device Q11 according to an embodiment. NVM cell 2011 is a modified version of NVM cell 1911. The two cells are similar structurally with one notable differences NVM cell 2011 has BTBT devices, while NVM cell 1911 has only one. BTBT device Q6 and BTBT device Q11 share FG 2017, and they are coupled serially. As an option, the two devices can be coupled parallel. Each of the BTBT devices has its own separate well electrode. Well electrode 2012 to bias the BTBT device Q6 to trigger a BTBT in device Q6. Well electrode 2035 to bias the BTBT device Q11 to trigger a BTBT in device Q11. Program select line 716 is set high to turn on transistor Q8 during the program operation. Operational behaviors of the two cells are similar, with one exception. In this case, BTBT device Q6 is only used to inject hot electrons, while BTBT device Q11 is only used to inject hot holes. Using two BTBT devices, charge levels corresponding to any of the valid distinct logic levels can be written onto FG 2017.

FIG. 20B is table 2050 that shows ML possible operating conditions for NVM cell 2011 according to an embodiment. Interpretations of data are the same as of table 1950 with one exception. Programming sequence described in relationship to FIG. 15 need not be observed, since charges can be moved onto and removed from FG 2017 in any order. It should also be noted that table 2050 also describes control conditions for a read operation.

Numerous details have been set forth in this description, which is to be taken as a whole, to provide a more thorough understanding of the invention. In other instances, well-known features have not been described in detail, so as to not obscure unnecessarily the invention.

The invention includes combinations and subcombinations of the various elements, features, functions and/or properties disclosed herein. The following claims define certain combinations and subcombinations, which are regarded as novel and non-obvious. Additional claims for other combinations and subcombinations of features, functions, elements, and/or properties may be presented in this or a related document.

The invention claimed is:

1. A Non-Volatile Memory (NVM) cell capable of denoting at least two distinct logic levels, comprising:
   a read-transistor having a floating gate;
   at least a first Band-To-Band-Tunneling device (BTBT device) sharing the floating gate with the read-transistor, the first BTBT device configured as an injection device for injecting a first charge onto the floating gate when the first BTBT device is biased with a first gate bias voltage such that the BTBT device is in accumulation, to set at least one of the logic levels; and
   a first electrode coupled to bias the first BTBT device with a first bias voltage that will put the BTBT device into accumulation during charge injection.

2. The cell of claim 1, in which
   the BTBT device has a gate dielectric and a well region, and
   the first electrode is coupled to the well region for biasing the first BTBT device, the biasing resulting in a self extinguishing band-to-band-tunneling current within a semiconductor substrate of the BTBT device, the band-to-band-tunneling current inducing an injection current that flows through a gate dielectric into the floating gate to establish a first amount of electric charge on the floating gate.

3. The cell of claim 1, in which
   an injected amount of charge on the floating gate is determined by the first bias voltage.

4. The cell of claim 1, further comprising:
   a third transistor coupled in series with the first BTBT device, a first select line being coupled to the third transistor, the third transistor providing a current to the first BTBT device during a memory write operation; and
   a fourth transistor coupled in series with the read-transistor, a second select line being coupled to the fourth transistor, the fourth transistor providing a current to the read-transistor during a memory read operation.

5. The cell of claim 1, further comprising:
   a fifth transistor having a fifth gate that is part of the floating gate, the fifth transistor used for Fowler-Nordheim tunneling to move charge onto the floating gate.

6. The cell of claim 1, further comprising:
   a bias-capacitor coupled to the floating gate, and in which the bias-capacitor is used to further adjust a voltage level on the floating gate during a write operation.

7. The cell of claim 1, further comprising:
a second BTBT device complementary to the first BTBT device, the second BTBT device sharing the floating gate with the first BTBT device and capable of injecting a second charge onto the floating gate that has a polarity opposite to that of the first charge.

8. The cell of claim 7, in which
the first BTBT device is of a polarity opposite to a polarity of the second BTBT device.

9. The cell of claim 7, in which
the second BTBT device is coupled in series with the first BTBT device.

10. The cell of claim 7, in which
the second BTBT device is coupled in parallel with the first BTBT device.

11. The cell of claim 7, in which
a second electrode is coupled to a well region of the second BTBT device, for biasing the second BTBT device with a third bias voltage that puts the second BTBT device in accumulation during the write operation.

12. The cell of claim 1, in which
a section of the floating gate that is part of the first BTBT device is formed from a doped poly.

13. The cell of claim 12, in which
the first BTBT device is a NMOS device that has no LDD implant, and
the gate is doped with N-type impurities.

14. The cell of claim 12, in which
the first BTBT device is a PMOS device that has no LDD implant, and
the gate is doped with P-type impurities.

15. The cell of claim 1, further comprising:
a select transistor, and
in which a gate dielectric of the first BTBT device is thicker than a gate dielectric of the select transistor.

16. The cell of claim 1, in which
a doping level in at least part of the channel region of the first BTBT device is higher than a doping level in a channel region of the read-transistor.

17. The cell of claim 1, in which
a doping level in a region under a spacer next to the gate of the first BTBT device is higher than a doping level of another device having a substantially similar gate oxide thickness.

18. The cell of claim 1, in which
the BTBT device is connected in such a way that charge injection onto the floating gate is prevented by the device through other means than a BTBT induced injection.

19. The cell of claim 1, in which
the cell is capable of denoting at least four distinct logic levels, and
the floating gate can achieve four distinct charge levels corresponding to the four distinct logic levels.

20. A method of operating a non-volatile memory (NVM) cell having a floating gate that can be charged with amounts of charge representing at least two respective logic levels, the cell having at least a first Band-To-Band-Tunneling device (BTBT device) configured to inject a predetermined amount of charge onto the floating gate, comprising:
applying a first bias voltage to the cell, the first bias voltage being as such that it keeps the first BTBT device in accumulation, and to charge the floating gate to a first charging level corresponding to one of the logic levels; and
continuing to apply the first bias voltage until a conductive channel region is formed in the BTBT device.

21. The method of claim 20, in which
the charge buildup on the floating gate stops when a conductive channel region is formed under the gate of the BTBT device.

22. The method of claim 20, further comprising:
removing the first bias voltage after a depletion region is formed in the conductive channel region.

23. The method of claim 20, further comprising:
determining the first bias voltage for the write operation that is appropriate for the desired logic level.

24. The method of claim 20, in which
the cell includes a program select line coupled to the first BTBT device, and further comprising: activating the program select line to permit a current to flow through the first BTBT device.

25. The method of claim 20, in which
an injected amount of charge on the floating gate is substantially independent of a duration of an application of the first bias voltage.

* * * * *